US009978768B2

(12) United States Patent
Xu et al.

(10) Patent No.: US 9,978,768 B2
(45) Date of Patent: May 22, 2018

(54) METHOD OF MAKING THREE-DIMENSIONAL SEMICONDUCTOR MEMORY DEVICE HAVING LATERALLY UNDULATING MEMORY FILMS

(71) Applicant: SANDISK TECHNOLOGIES LLC, Plano, TX (US)

(72) Inventors: Jiyin Xu, Yokkaichi (JP); Ryoichi Honma, Yokkaichi (JP); Syo Fukata, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days. days.

(21) Appl. No.: 15/196,714

(22) Filed: Jun. 29, 2016

(65) Prior Publication Data
US 2018/0006041 A1    Jan. 4, 2018

(51) Int. Cl.
*H01L 27/1157* (2017.01)
*H01L 27/11582* (2017.01)
(Continued)

(52) U.S. Cl.
CPC .... *H01L 27/1157* (2013.01); *H01L 21/02063* (2013.01); *H01L 27/11573* (2013.01); *H01L 27/11582* (2013.01)

(58) Field of Classification Search
CPC ............. H01L 27/1157; H01L 21/02063
(Continued)

(56) References Cited

U.S. PATENT DOCUMENTS 5,915,167 A    6/1999  Leedy
7,177,191 B2   2/2007  Fasoli et al.
(Continued)

FOREIGN PATENT DOCUMENTS

WO    WO2002/015277 A2    2/2002
WO    WO2012/003301 A2    1/2012
(Continued)

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Caleb Henry
(74) *Attorney, Agent, or Firm* — The Marbury Law Group PLLC

(57) ABSTRACT

A method of manufacturing a semiconductor device includes forming a stack of alternating layers comprising insulating layers and spacer material layers over a substrate, forming a memory opening through the stack, forming a layer stack including a memory material layer, a tunneling dielectric layer, and a first semiconductor material layer in the memory opening, forming a protective layer over the first semiconductor channel layer, physically exposing a semiconductor surface underneath the layer stack by anisotropically etching horizontal portions of the protective layer and the layer stack at a bottom portion of the memory opening, removing a remaining portion of the protective layer selective to the first semiconductor channel layer, and forming a second semiconductor channel layer on the first semiconductor channel layer.

19 Claims, 17 Drawing Sheets

(51) Int. Cl.
H01L 21/02 (2006.01)
H01L 27/11573 (2017.01)

(58) Field of Classification Search
USPC .......................................................... 438/269
See application file for complete search history.

(56) References Cited

U.S. PATENT DOCUMENTS

| | | | |
|---|---|---|---|
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,745,265 | B2 | 6/2010 | Mokhlesi et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,349,681 | B2 | 1/2013 | Alsmeier et al. |
| 8,614,126 | B1 | 12/2013 | Lee et al. |
| 8,658,499 | B2 | 2/2014 | Makala et al. |
| 8,884,357 | B2 | 11/2014 | Wang et al. |
| 8,946,023 | B2 | 2/2015 | Makala et al. |
| 9,023,719 | B2 | 5/2015 | Pachamuthu et al. |
| 9,236,396 | B1 | 1/2016 | Koka et al. |
| 9,305,849 | B1 | 4/2016 | Tsutsumi et al. |
| 9,412,749 | B1* | 8/2016 | Shimabukuro ..... H01L 27/11582 |
| 2007/0210338 | A1 | 9/2007 | Orlowski |
| 2007/0252201 | A1 | 11/2007 | Kito et al. |
| 2008/0169567 | A1 | 7/2008 | Kai et al. |
| 2009/0283819 | A1 | 11/2009 | Ishikawa et al. |
| 2010/0044776 | A1 | 2/2010 | Ishiduki et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0258852 | A1* | 10/2010 | Lim .................. H01L 27/11551 257/324 |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0233648 | A1 | 9/2011 | Seol et al. |
| 2011/0266606 | A1 | 11/2011 | Park et al. |
| 2011/0291178 | A1 | 12/2011 | Sasaki et al. |
| 2012/0001247 | A1 | 1/2012 | Alsmeier |
| 2012/0001249 | A1 | 1/2012 | Alsmeier |
| 2012/0001252 | A1 | 1/2012 | Alsmeier et al. |
| 2012/0068247 | A1 | 3/2012 | Lee et al. |
| 2012/0146127 | A1 | 6/2012 | Lee et al. |
| 2012/0153372 | A1 | 6/2012 | Kim et al. |
| 2012/0156848 | A1 | 6/2012 | Yang et al. |
| 2012/0256247 | A1 | 10/2012 | Alsmeier |
| 2013/0134492 | A1 | 5/2013 | Yang et al. |
| 2013/0248974 | A1 | 9/2013 | Alsmeier et al. |
| 2013/0264631 | A1 | 10/2013 | Alsmeier et al. |
| 2013/0313627 | A1 | 11/2013 | Lee et al. |
| 2014/0225181 | A1 | 8/2014 | Makala et al. |
| 2014/0264525 | A1 | 9/2014 | Takahashi et al. |
| 2014/0264533 | A1 | 9/2014 | Simsek-Ege et al. |
| 2014/0264542 | A1 | 9/2014 | Simsek-Ege et al. |
| 2014/0273373 | A1 | 9/2014 | Makala et al. |
| 2014/0295636 | A1 | 10/2014 | Makala et al. |
| 2014/0353738 | A1 | 12/2014 | Makala et al. |
| 2015/0008503 | A1 | 1/2015 | Makala et al. |
| 2015/0076580 | A1 | 3/2015 | Pachamuthu et al. |
| 2015/0076584 | A1 | 3/2015 | Pachamuthu et al. |
| 2015/0179660 | A1 | 6/2015 | Yada et al. |

FOREIGN PATENT DOCUMENTS

| | | |
|---|---|---|
| WO | WO2015038427 A1 | 3/2015 |
| WO | WO2016043990 A1 | 3/2016 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, Masahide "3D Cells Make Terabit NAND Flash Possible," Nikkei Electronics Asia, Sep. 17, 2009, 6pgs.

International Search Report & Written Opinion, PCT/US2011/042566, dated Jan. 17, 2012.

Invitation to Pay Additional Fees & Partial International Search Report, PCT/US2011/042566, dated Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.jp/english/NEWS_EN/200906 19/1977/ Nikkei Microdevices, Tech-On, Jun. 19, 2009.

Li et al., "Sacrificial Polymers for Nanofluidic Channels in Biological Applications", Nanotechnology 14 (2003) 578-583.

Invitation to Pay Additional Fees, including Annex to Form PCT/ISA/206 Communication Relating to the Results of the Partial International Search for PCT/US2014/048160, dated October 31, 2014.

International Search Report & Written Opinion received in connection with international application PCT/US2014/032123, dated Sep. 22, 2014.

Non-Final Office Action for U.S. Appl. No. 14/539,307, dated Jul. 17, 2015, 19 sheets.

Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).

Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.

Trowbridge et al., "Enhanced Oxidation of Silicon Nitride Using In Situ Steam Generation," 199th ECS Conf. vol. 2000. 2001.

Invitation to Pay Additional Fees and International Searching Authority including Communication Relating to the Results of the Partial International Search for PCT/US2014/047480 dated Oct. 7, 2014.

International Search Report and Written Opinion received in connection with international Application No. PCT/US2014/047480; dated Jan. 5, 2015.

Notice of Allowance and Fee(s) Due for U.S. Appl. No. 14/225,116, filed Mar. 25, 2014 (12 pages).

U.S. Appl. No. 14/523,287, filed Oct. 24, 2014, SanDisk Technologies LLC.

U.S. Appl. No. 14/539,307, filed Nov. 12, 2014, SanDisk Technologies LLC.

U.S. Appl. No. 14/539,372, filed Nov. 12, 2014, SanDisk Technologies LLC.

(56) References Cited

OTHER PUBLICATIONS

U.S. Appl. No. 14/600,226, filed Jan. 20, 2015, SanDisk Technologies LLC.
U.S. Appl. No. 14/620,674, filed Feb. 12, 2015, SanDisk Technologies LLC.
U.S. Appl. No. 14/804,564, filed Jul. 21, 2015, SanDisk Technologies LLC.
ntemational Search Report and Written Opinion of the International Searching Authority for International Patent Application No. PCT/US2017/019496, dated May 16, 2017, 14 pages.

* cited by examiner

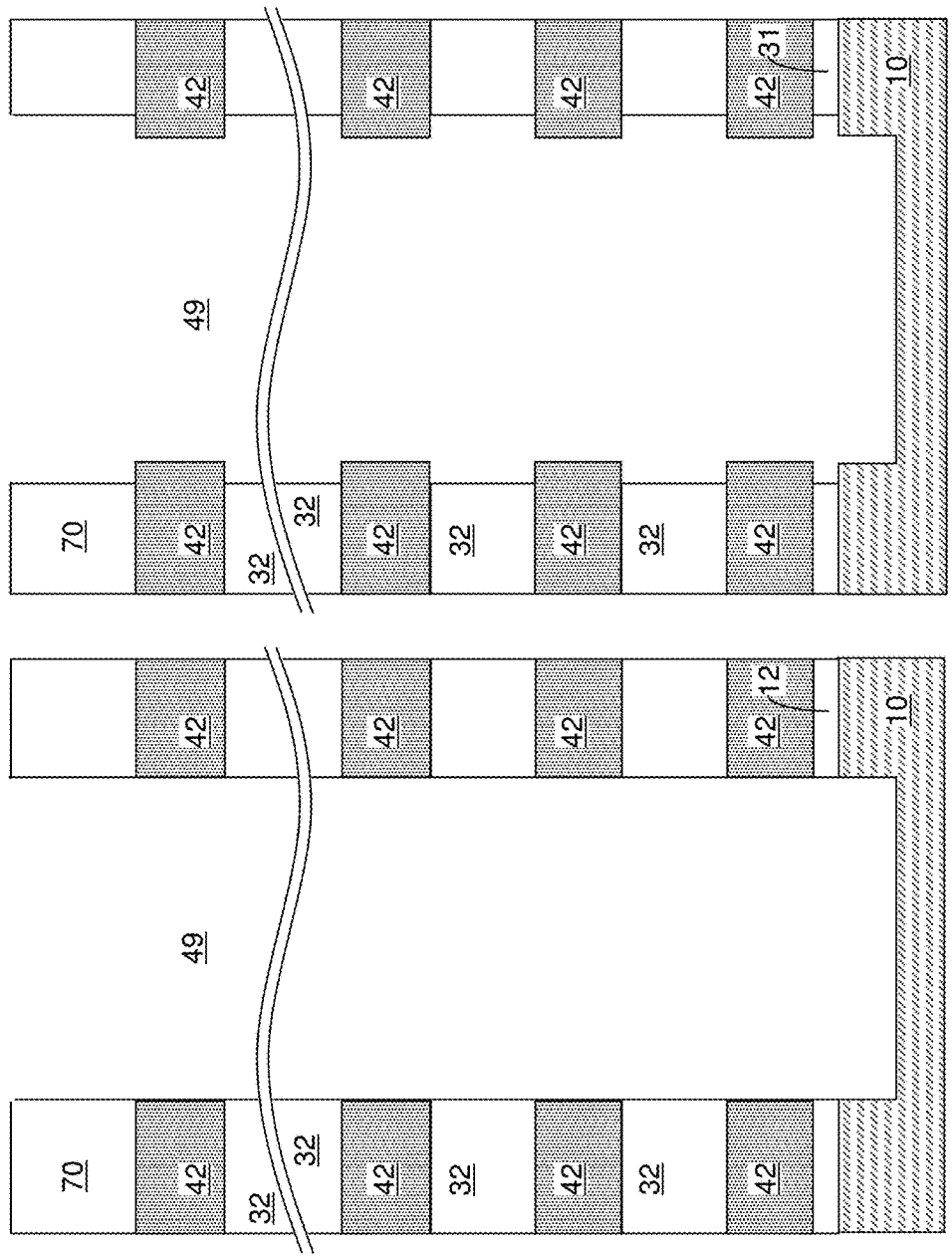

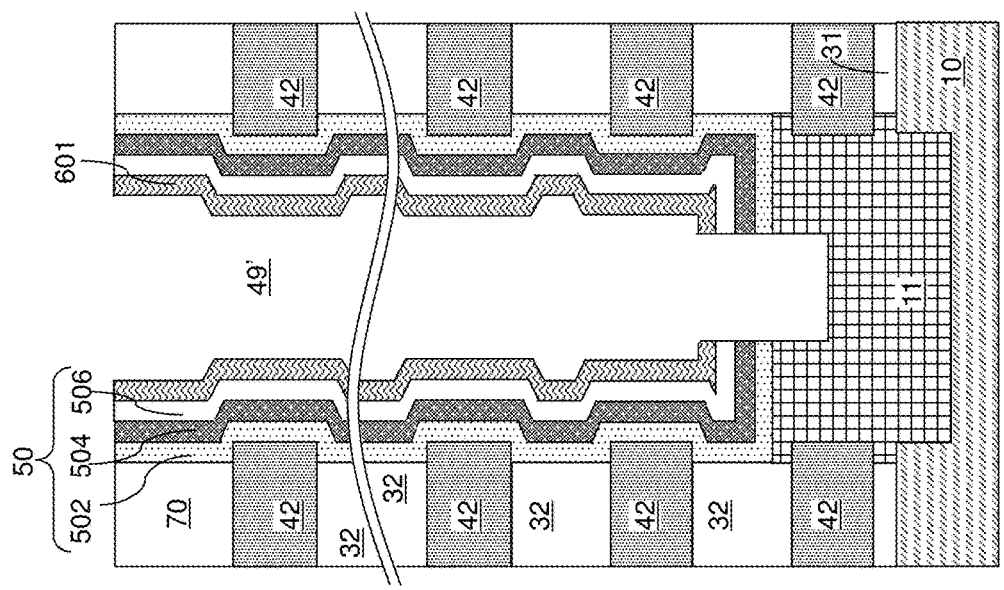
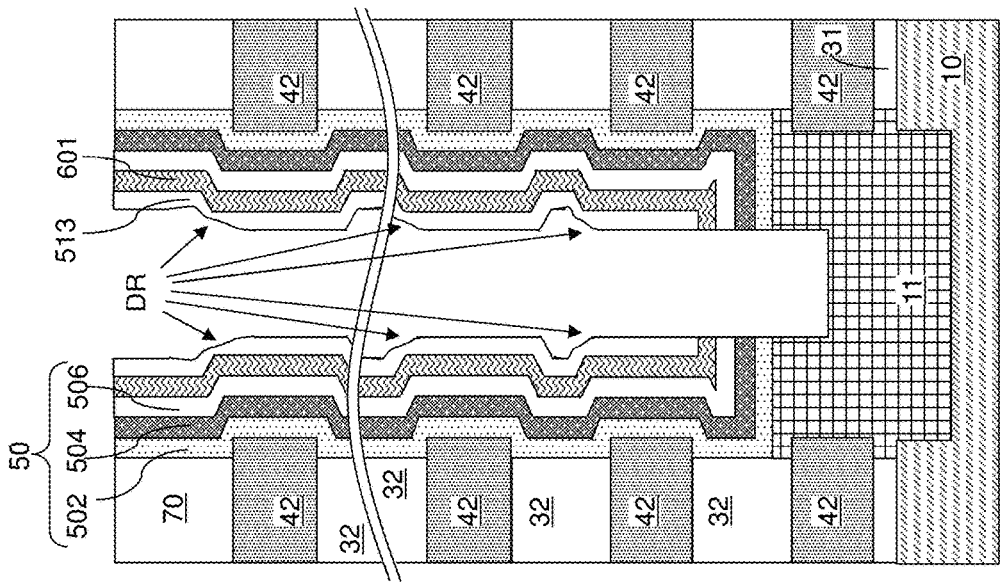

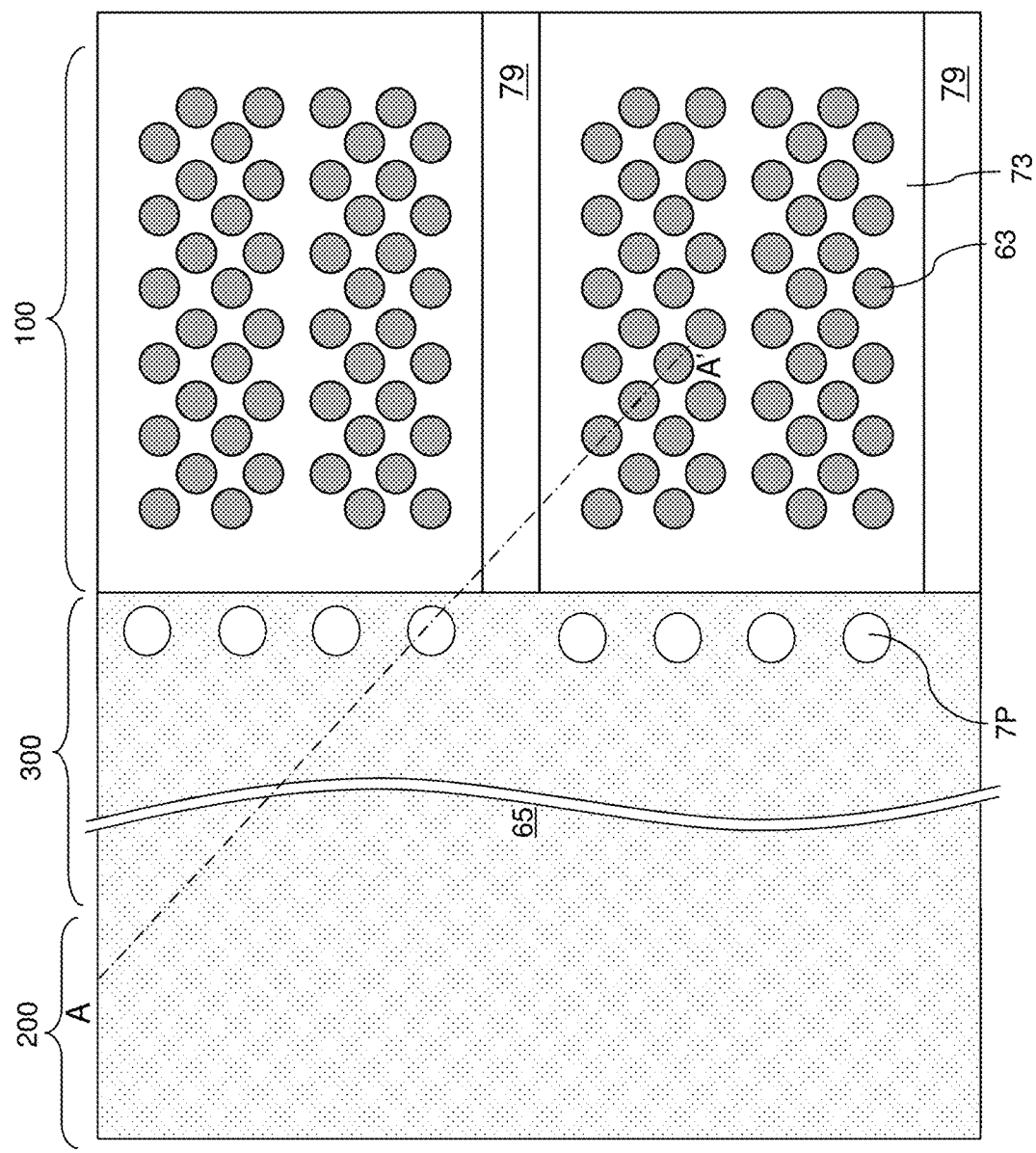

METHOD OF MAKING THREE-DIMENSIONAL SEMICONDUCTOR MEMORY DEVICE HAVING LATERALLY UNDULATING MEMORY FILMS

FIELD

The present disclosure relates generally to the field of semiconductor devices and specifically three-dimensional semiconductor devices including a vertical semiconductor channel, and methods of making the same.

BACKGROUND

A dual layer semiconductor channel employed for vertical memory devices provides the benefit of protecting an underlying memory film, and particularly the tunneling dielectric therein, during an anisotropic etch that removes a bottom portion of the memory film to physically expose surfaces of a semiconductor substrate that includes horizontal portions of semiconductor channels. A first semiconductor channel layer is deposited prior to the anisotropic etch over the tunneling dielectric, and a second semiconductor channel layer is deposited after the anisotropic etch directly on a surface of the semiconductor substrate and on remaining vertical portions of the first semiconductor channel layer.

SUMMARY

According to an aspect of the present disclosure, a method of manufacturing a semiconductor device includes forming a stack of alternating layers comprising insulating layers and spacer material layers over a substrate, forming a memory opening through the stack, forming a layer stack including a memory material layer, a tunneling dielectric layer, and a first semiconductor material layer in the memory opening, forming a protective layer over the first semiconductor channel layer, physically exposing a semiconductor surface underneath the layer stack by anisotropically etching horizontal portions of the protective layer and the layer stack at a bottom portion of the memory opening, removing a remaining portion of the protective layer selective to the first semiconductor channel layer, and forming a second semiconductor channel layer on the first semiconductor channel layer.

BRIEF DESCRIPTION OF THE DRAWINGS

FIGS. 4A-4J are sequential vertical cross-sectional views of a memory opening within the exemplary structure during various processing steps employed to form an exemplary memory stack structure according to an embodiment of the present disclosure.

FIG. 6B is a partial see-through top-down view of the exemplary structure of FIG. 6A. The vertical plane A-A' is the plane of the vertical cross-sectional view of FIG. 6A.

DETAILED DESCRIPTION

Figure 1:
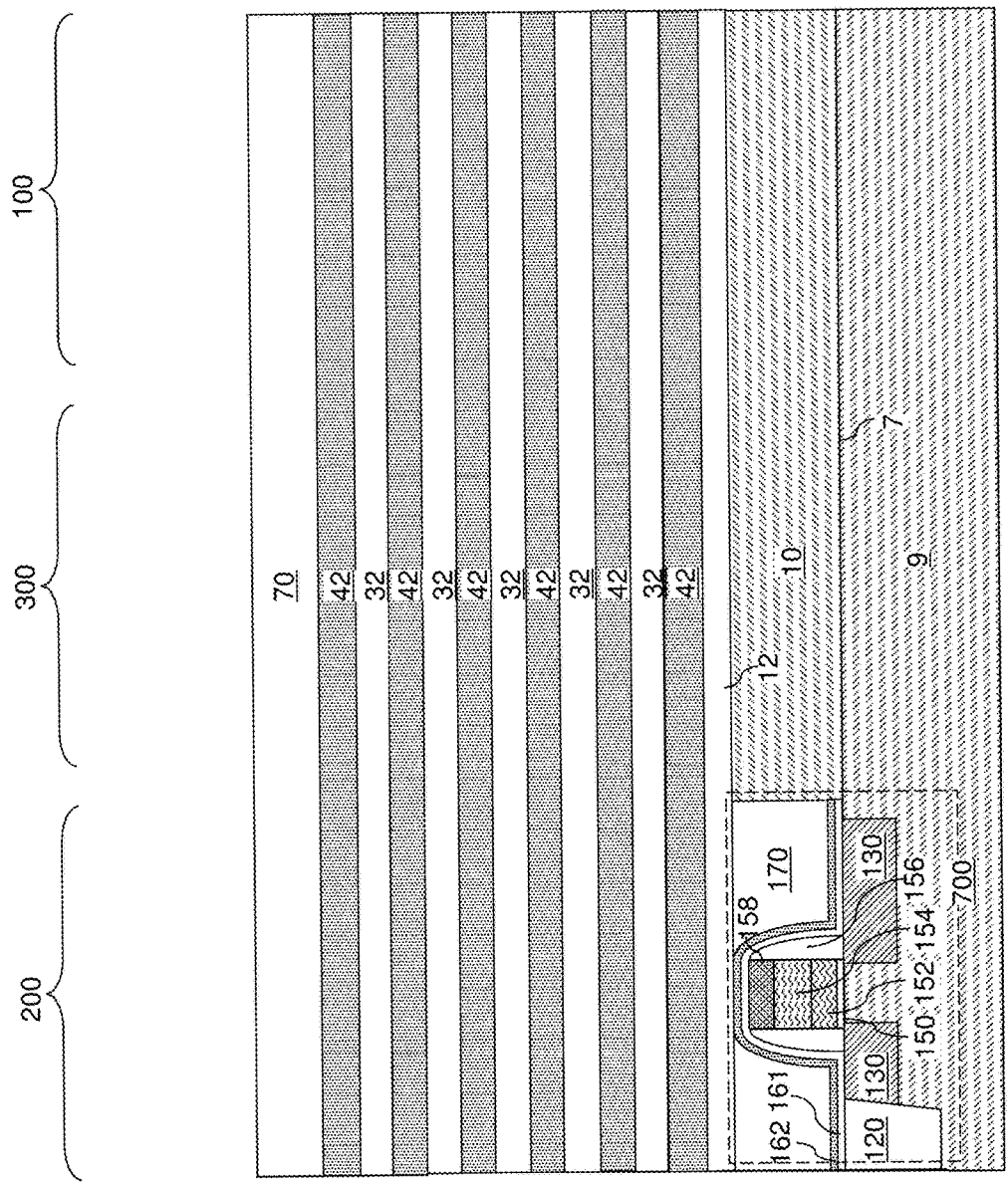
FIG. 1 is a vertical cross-sectional view of an exemplary structure after formation of a stack including an alternating plurality of material layers according to an embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. For example, a layer may be located between any pair of horizontal planes between, or at, a top surface and a bottom surface of the contiguous structure. A layer may extend horizontally, vertically, and/or along a tapered surface. A substrate may be a layer, may include one or more layers therein, and/or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9, which can be a layer located on an underlying substrate or which can be the underlying substrate, such as a single crystal silicon wafer. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a single crystalline semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above, such as single crystalline silicon. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

A dielectric pad layer 12 can be formed above the semiconductor material layer 10. The dielectric pad layer 12 can be a gate dielectric layer that vertically separates horizontal portions of semiconductor channels in an upper portion of the semiconductor material layer 10 and select gate electrodes to be subsequently formed by replacing a bottommost sacrificial material layer 42. The dielectric pad layer 12 can be, for example, a silicon oxide layer, an organosilicate glass layer, a dielectric metal oxide layer, or a combination thereof. The thickness of the dielectric pad layer 12 can be in a range from 1 nm to 10 nm, although lesser and greater thicknesses can also be employed. In one embodiment, the dielectric pad layer 12 can include a dielectric compound including silicon atoms and oxygen atoms. For example, the dielectric pad layer 12 can include undoped silicate glass, doped silicate glass, organosilicate glass, or a porous derivative thereof.

A stack of an alternating plurality of first material layers (which can be insulating layers 32) and second material layers (which can be sacrificial material layers 42) is formed over the top surface of the substrate, which can be, for example, on the top surface of the dielectric pad layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a spacer material layer that provides vertical separation between a vertically neighboring pair of insulating layers 32.

In one embodiment, the spacer material layers can be permanent layers that are not subsequently replaced with a different material. In this case, the spacer material layers can include a conductive material such as doped semiconductor material (such as doped polysilicon or a doped silicon-containing alloy). Alternatively, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality of layers is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide. In one embodiment, the insulating layers 32 can include a dielectric compound including silicon atoms and oxygen atoms. For example, the insulating layers 32 can include undoped silicate glass, doped silicate glass, organosilicate glass, or a porous derivative thereof.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 2:
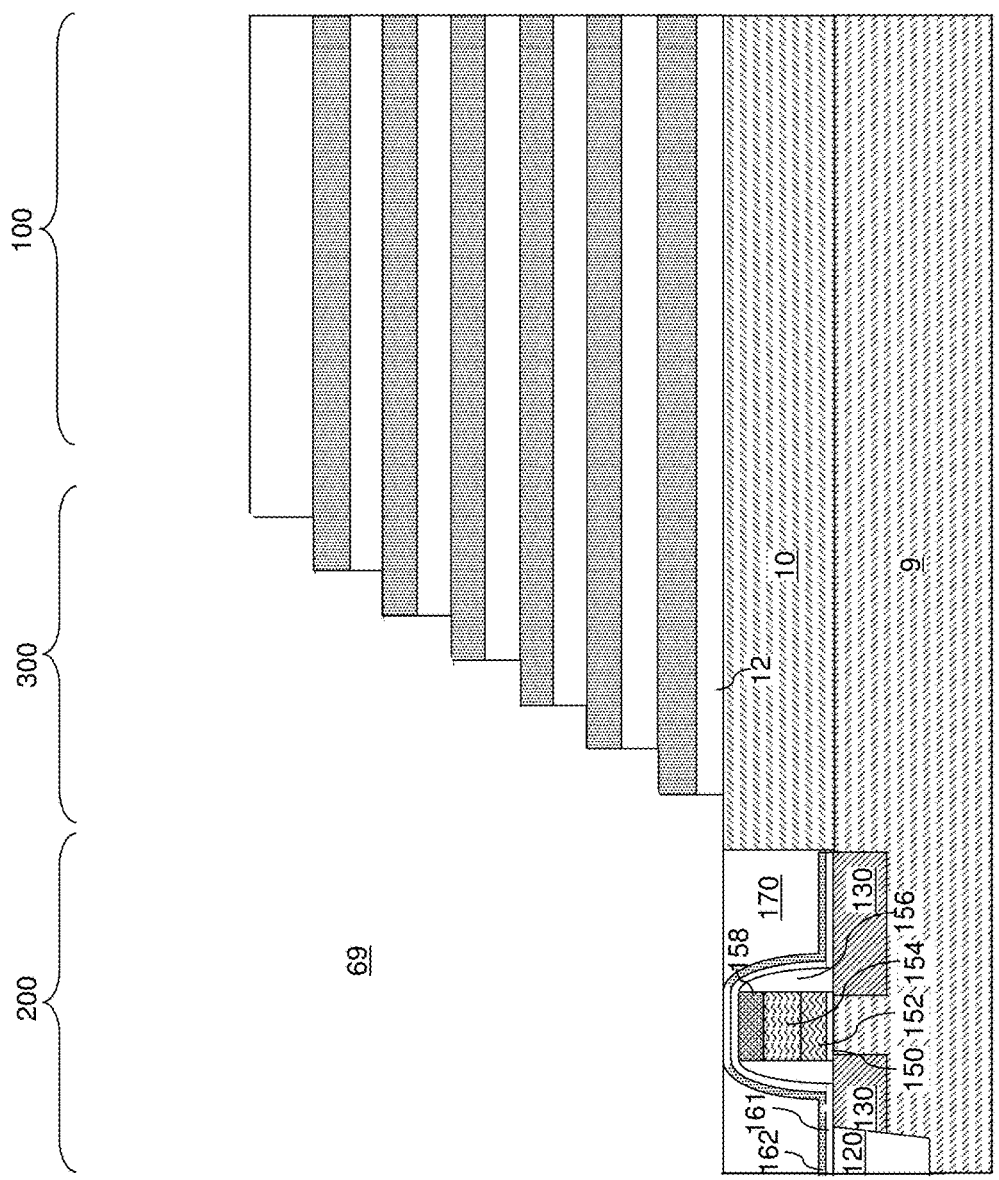
FIG. 2 is a vertical cross-sectional view of the exemplary structure after formation of stepped terraces in a contact region according to an embodiment of the present disclosure.

Referring to FIG. 2, a stepped cavity 69 can be formed within the contact region 300 and optionally in the peripheral region 200. The contact region 200 is located between the device region 100 and the peripheral region 200 containing the at least one semiconductor device for the peripheral circuitry. The stepped cavity 69 can have various stepped surfaces such that the horizontal cross-sectional shape of the stepped cavity 69 changes in steps as a function of the vertical distance from the top surface of the substrate (9, 10). In one embodiment, the stepped cavity 69 can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

A peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

Figure 3:
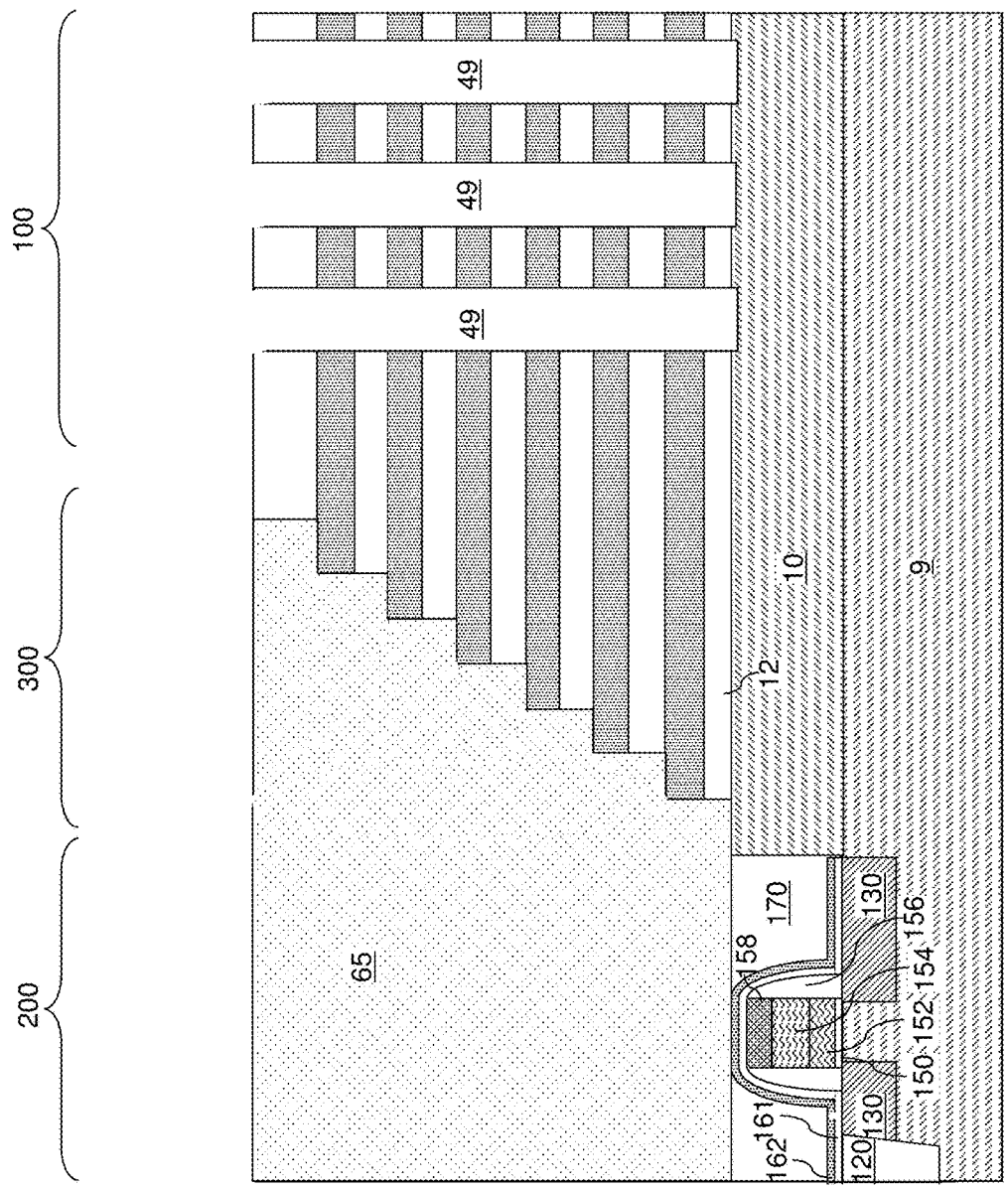
FIG. 3 is a vertical cross-sectional view of the exemplary structure after formation of a retro-stepped dielectric material portion according to an embodiment of the present disclosure.

Referring to FIG. 3, a retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Subsequently, a lithographic material stack (not shown) including at least a photoresist layer can be formed over the insulating cap layer 70 and the retro-stepped dielectric material portion 65, and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 can be substantially vertical, or can be tapered. The patterned lithographic material stack can be subsequently removed, for example, by ashing.

The memory openings 49 are formed through the dielectric pad layer 12 so that the memory openings 49 extend from the top surface of the alternating stack (32, 42) to at least the top surface of the semiconductor material layer 10. In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10.

Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the substrate semiconductor layer 9.

A memory stack structure can be formed in each of the memory openings 49. FIGS. 4A-4J illustrate sequential vertical cross-sectional views of a memory opening 49 within the exemplary structure during formation of an exemplary memory stack structure according to an embodiment of the present disclosure.

Referring to FIG. 4A, a memory opening 49 in the exemplary structure of FIG. 3 is illustrated in a magnified view. The memory opening 49 extends through the insulating cap layer 70, the alternating stack (32, 42), the dielectric pad layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed.

Referring to FIG. 4B, the physically exposed semiconductor surfaces of the semiconductor material within the substrate (9, 10) underneath the memory opening 49 is cleaned to remove a surface oxide material (i.e., a "native oxide" material). The surface oxide material can be formed on the physically exposed semiconductor surfaces of the semiconductor material within the substrate (9, 10) by physical exposure of the semiconductor surface to an oxygen-containing ambient during transport of the exemplary structure from a process chamber that performs the anisotropic etch process to form the memory openings to another process chamber, such as a process chamber for removal of the photoresist layer that functions as an etch mask during the anisotropic etch or a process chamber for forming an epitaxial channel portion in a subsequent selective epitaxy process. Oxygen combines with the semiconductor atoms (such as silicon atoms) on the physically exposed surfaces of the substrate (9, 10) to form a surface layer of silicon oxide having a thickness in a range from 0.3 nm to 1.0 nm. The surface oxide material may form a continuous layer or discrete islands depending on the thickness. The thickness of the surface oxide depends on the concentration of oxygen in the ambient, the exposure time of the semiconductor surface, and the ambient temperature during exposure to the oxygen-containing ambient.

Removal of the surface oxide material from the physically exposed semiconductor surfaces of the substrate (9, 10) facilitates epitaxial alignment of a semiconductor material to be deposited on the physically exposed semiconductor surfaces in a subsequent selective epitaxial deposition process. Presence of a surface oxide material (such as silicon oxide) on the surface of the substrate (9, 10) at the bottom of the memory opening 49 can adversely impact epitaxial alignment of the deposited semiconductor material and the single crystalline semiconductor structure of the portion of the substrate (9, 10) that underlies the memory opening 49. The physically exposed semiconductor surface can be a horizontal surface and sidewall surfaces of an upper portion of the semiconductor material layer 10. In case the semiconductor material layer 10 is not employed, the physically exposed semiconductor surface can be a horizontal surface and sidewall surfaces of an upper portion of the substrate semiconductor layer 9. While the present disclosure is described employing an embodiment in which the substrate (9, 10) includes the semiconductor material layer 10, embodiments are expressly contemplated herein in which semiconductor surfaces of the substrate semiconductor layer 9 are physically exposed at the bottom of each memory opening 49.

In one embodiment, the insulating layers 32 can include a dielectric compound including silicon atoms and oxygen atoms. For example, the insulating layers 32 can include a dielectric material such as undoped silicate glass, doped silicate glass, organosilicate glass, or a porous derivative thereof. In one embodiment, the spacer material layers (i.e., the sacrificial material layer 42) can include silicon nitride.

The removal of the surface oxide material from the physically exposed semiconductor surfaces of the substrate (9, 10) in preparation for the subsequent selective epitaxy process is herein referred to as a preclean process. The preclean process can be performed employing an etchant that removes the surface oxide from the physically exposed semiconductor surfaces of the substrate (9, 10). The etchant may be in a liquid form (such as hydrofluoric acid) or in a vapor form (such as hydrofluoric acid vapor).

Cleaning of the physically exposed surface of the semiconductor material within the substrate (9, 10) can induce collateral etching of the insulating layers 32. For example, in case the insulating layers 32 include a dielectric compound including silicon atoms and oxygen atoms, and the sacrificial material layers 42 include a material that has a substantially lower etch rate than the insulating layers 32 upon exposure of the etchant of the preclean process, or include a material that is not affected by the etchant of the preclean process, the insulating layers 32 can be collaterally etched during the preclean process. In this case, sidewalls of the insulating layers 32 can be collaterally recessed laterally selective to sidewalls of the spacer material layers (i.e., the sacrificial material layers 42) during cleaning of the physically exposed surface of the semiconductor material within the substrate (9, 10). In one embodiment, the insulating layers 32 can be silicon oxide layers which are collaterally recessed by an isotropic etch employing hydrofluoric acid during the preclean process.

Figure 4D:
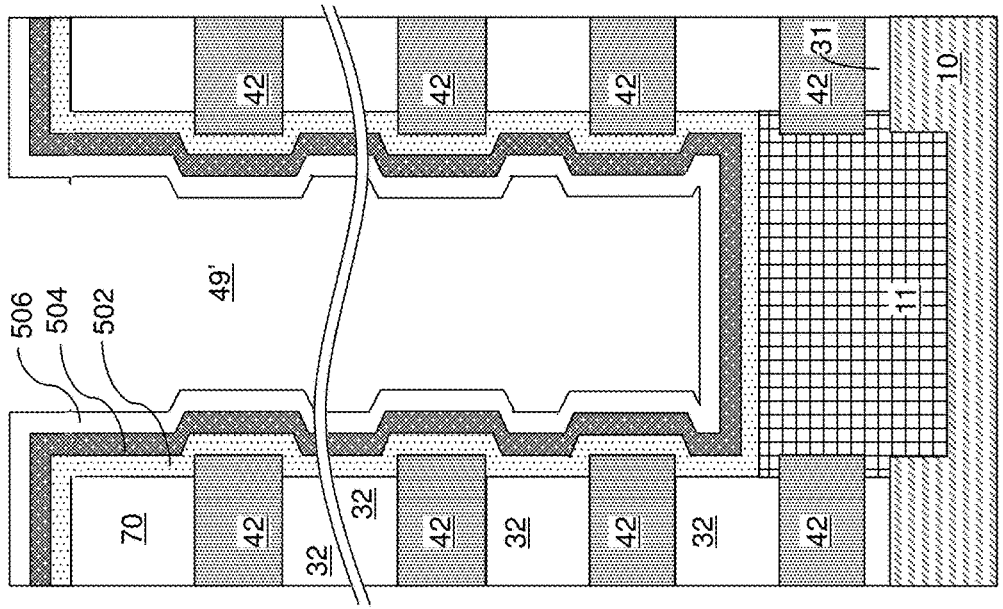
Figure 4C:
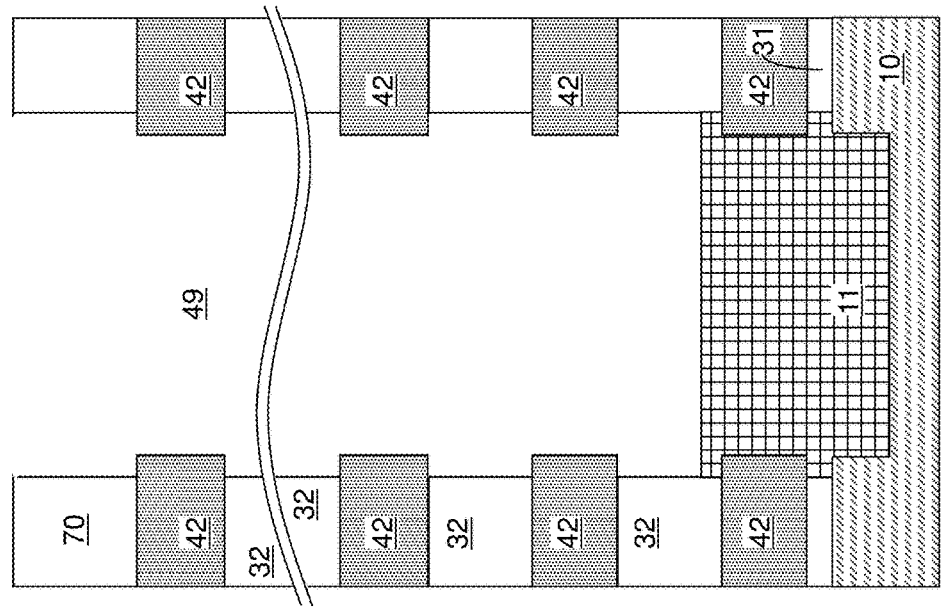

Referring to FIG. 4C, an epitaxial channel portion 11 can be formed at the bottom portion of each memory opening 49, for example, by a selective epitaxy process. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer.

The selective epitaxy process can be performed by simultaneously or alternately flowing a reactant gas including at least one semiconductor atom and an etchant that etches deposited semiconductor material. The deposited semiconductor material from the reactant gas displays different deposition rates and/or nucleation rates depending on the nature of the surface. Specifically, a semiconductor material is deposited on crystalline semiconductor surfaces at a greater deposition rate than on amorphous surfaces such as the dielectric surfaces of the insulating layers 32 and the sacrificial material layers 42. The flow rate and/or duration of the etchant can be set such that the etch rate of the semiconductor material is greater than the deposition rate (and/or the nucleation rate) of the semiconductor material on a crystalline semiconductor surface, and is less than the deposition rate (and/or the nucleation rate) of the semiconductor material on the surfaces of the insulating layers 32 and the sacrificial material layers 42. In this case, net deposition of the semiconductor material occurs on the physically exposed semiconductor surfaces of the substrate (9, 10), while deposition of the semiconductor material does not occur on any of the dielectric surfaces (including the surfaces of the insulating layers 32 and the sacrificial material layers 42).

In one embodiment, the reactant can include a semiconductor hydride precursor (such as $SiH_4$, $SiH_2Cl_2$, $SiHCl_3$, $Si_2H_6$, $GeiH_4$, $Ge_2H_6$, etc) or a combination thereof. Optionally, a carrier gas such as hydrogen or nitrogen can be employed. Alternatively, a non-hydride semiconductor precursor gas (such as $SiCl_4$) can be flowed with hydrogen carrier gas. The etchant can be gas phase hydrogen chloride (HCl). The reactant and the etchant can be flowed into a process chamber simultaneously, or can be flowed alternately. The single crystalline structure of the epitaxial channel portion 11 is in epitaxial alignment with the single crystalline structure of the semiconductor material within the substrate (9, 10). Generally speaking, the lesser the residual semiconductor oxide on the physically exposed surfaces of the substrate (9, 10) at the time of initiation of the epitaxial semiconductor deposition process, the higher the quality of the interface and epitaxial alignment between the epitaxial channel portion 11 and the substrate (9, 10).

The duration of the selective epitaxy process can be controlled such that the top surface of the epitaxial channel portion 11 is formed above a horizontal plane including the topmost surface of one or more sacrificial material layers 42 that will be replaced with a drain side select gate electrode, and below a horizontal plane including the topmost surface of the bottommost insulating layer 32 that will be located above the drain side select gate electrode. Surfaces of the memory opening 49 can include sidewalls of the sacrificial material layers 42, sidewalls of the insulating layers 32 that are recessed outward from the sidewalls of the sacrificial material layers 42, annular horizontal surfaces of the sacrificial material layers 42 that adjoin a respective sidewall of an insulating layer 32 and a respective sidewall of the sacrificial material layer 42, and a top surface of the epitaxial channel portion 11. As used herein, an "annular" element refers to an element including only one opening therethrough.

Referring to FIG. 4D, a blocking dielectric layer 502 can be deposited on the sidewalls of each memory opening 49 by a conformal deposition method. The blocking dielectric layer 502 can include a single dielectric material layer or a plurality of dielectric material layers. In one embodiment, the blocking dielectric layer 502 can include a silicon-based dielectric material such as silicon oxide, silicon oxynitride, silicon nitride, or a combination thereof. In one embodiment, the blocking dielectric layer 502 can include silicon oxide. The silicon-based dielectric material can be formed by a conformal deposition method such as low pressure chemical vapor deposition, atomic layer deposition, or a combination thereof. The thickness of the silicon-based dielectric material, if present, can be in a range from 1 nm to 20 nm, although lesser and greater thicknesses can also be employed.

Additionally or alternatively, the blocking dielectric layer 502 can include a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 502 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The blocking dielectric layer 502 can be deposited, for example, by chemical vapor deposition (CVD), atomic layer deposition (ALD), pulsed laser deposition (PLD), liquid source misted chemical deposition, or a combination thereof. The thickness of the blocking dielectric layer 502 can be in a range from 1 nm to 20 nm, although lesser and greater thicknesses can also be employed. The blocking dielectric layer 502 can subsequently function as a dielectric material portion that blocks leakage of stored electrical charges to control gate electrodes. In one embodiment, the blocking dielectric layer 502 includes aluminum oxide.

Alternatively, the blocking dielectric layer 502 can be omitted, and a blocking dielectric layer can be formed after formation of backside recesses by a conformal deposition process on surfaces of memory films to be subsequently formed.

Subsequently, a memory material layer 504 can be formed. In one embodiment, the memory material layer 504 can be a charge trapping material including a dielectric charge trapping material, which can be, for example, silicon nitride. The memory material layer 504 can be formed as a single memory material layer of homogeneous composition, or can include a stack of multiple memory material layers. In one embodiment, the memory material layer 504 may comprise an insulating charge trapping material such as silicon nitride. The memory material layer 504 can be formed, for example, by chemical vapor deposition (CVD), atomic layer deposition (ALD), physical vapor deposition (PVD), or any suitable deposition technique for storing electrical charges therein. The thickness of the memory material layer 504 can be in a range from 2 nm to 20 nm, although lesser and greater thicknesses can also be employed.

A tunneling dielectric layer 506 can be subsequently formed on the memory material layer 504. The tunneling dielectric layer 506 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506 can include a stack of a first silicon oxide layer, a silicon nitride layer or a silicon oxynitride layer, and a second silicon oxide (or oxynitride) layer, which is commonly known as an ONO stack.

In one embodiment, the ONO stack can be formed by deposition of a silicon oxide layer, nitridation of a surface portion of the silicon oxide layer into a silicon nitride layer, and oxidation of a surface portion of the silicon nitride layer into the second silicon oxide layer or a silicon oxynitride layer. In one embodiment, the portion of the initial silicon oxide layer that is not converted into the silicon nitride layer is the first silicon oxide layer within the ONO stack, and the portion of the silicon nitride layer that is converted back into a silicon oxide layer (or a silicon oxynitride layer) is the second silicon oxide layer (or the silicon oxynitride layer) within the ONO stack. Alternatively, the second silicon oxide layer can be formed by deposition of silicon oxide on the inner sidewalls of the silicon nitride layer (or the silicon oxynitride layer) that is formed by nitridation. In one embodiment, the tunneling dielectric layer 506 can be substantially free of carbon. The thickness of the tunneling dielectric layer 506 can be in a range from 2 nm to 20 nm, although lesser and greater thicknesses can also be employed.

Each layer among the blocking dielectric layer 503, the memory material layer 504, and the tunneling dielectric layer 506 can include respective outer (with respect to central vertical axis of memory opening 49) vertical portions formed at levels of the insulating layers 32, respective inner (with respect to central vertical axis of memory opening 49) vertical portions formed at levels of the sacrificial material layers 42, and respective annular portions connecting a respective neighboring pair of an outer vertical portion and an inner vertical portion of the layer.

Figure 4F:
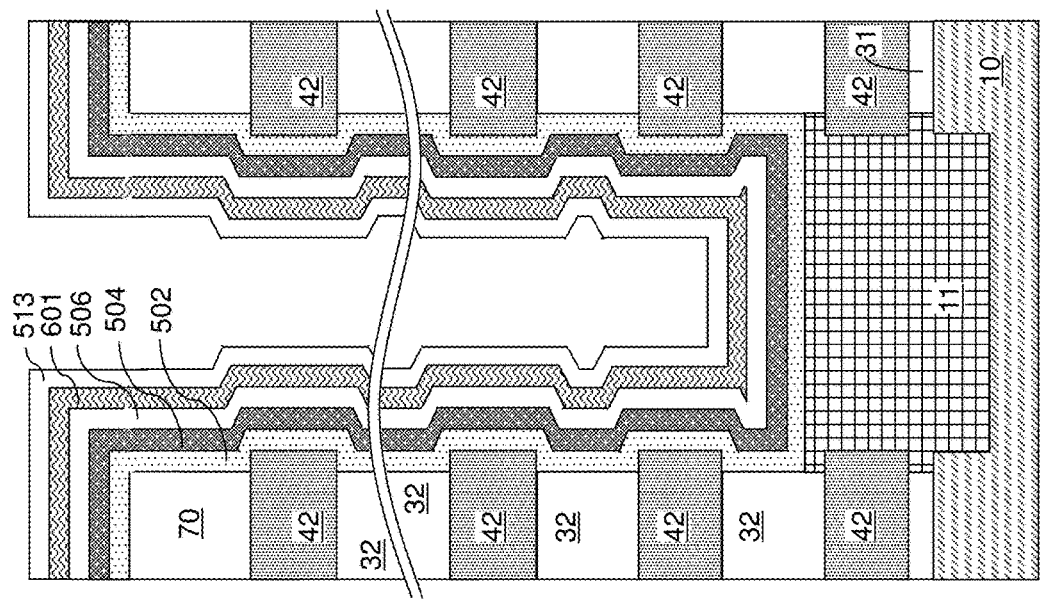
Figure 4E:
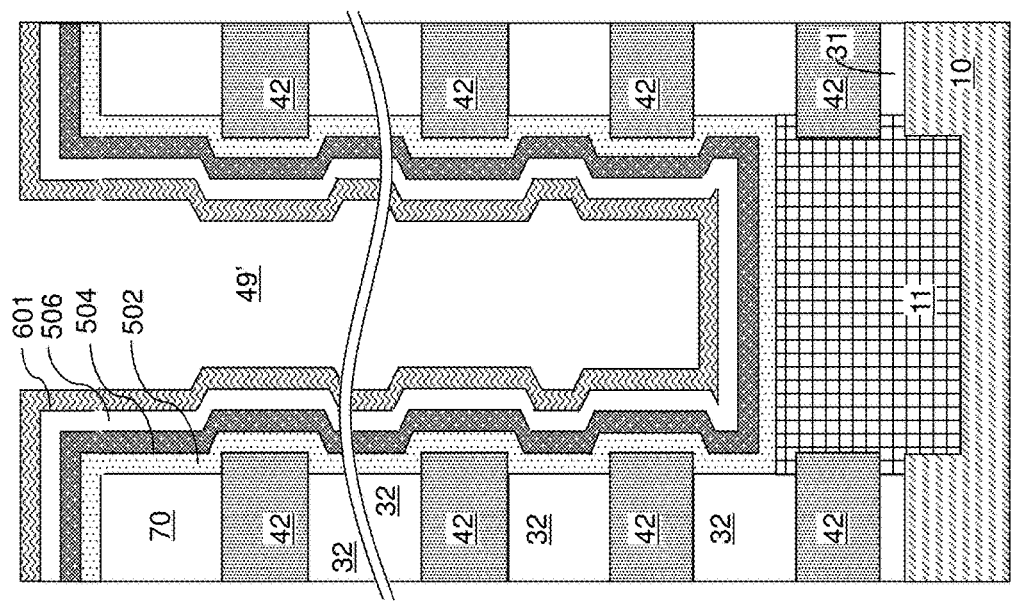

Referring to FIG. 4E, a first semiconductor channel layer 601 can be formed over the tunneling dielectric layer 506.

The first semiconductor channel layer 601 can be deposited directly on the tunneling dielectric layer 506. The first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. The semiconductor material of the first semiconductor channel layer 601 can be doped with dopants of the first conductivity type (i.e., of the same type of doping as the epitaxial channel portion and the semiconductor material layer 10), or may be undoped (i.e., not intentionally doped).

In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. The first semiconductor channel layer 601 can include outer vertical portions formed at levels of the insulating layers 32, inner vertical portions formed at levels of the sacrificial material layers 42, and annular portions connecting a respective neighboring pair of an outer vertical portion and an inner vertical portion of the first semiconductor channel layer 601. The processing steps of FIGS. 4D-4E form a layer stack including the optional the blocking dielectric layer 502, the memory material layer 504, the tunneling dielectric layer 506, and the first semiconductor channel layer 601, each of which includes respective outer vertical portions, inner vertical portions, and annular portions connecting a vertically neighboring pair of an inner vertical portion and an outer vertical portion. Horizontal surfaces and/or tapered surfaces can be present on each of the annular portions.

Referring to FIG. 4F, a protective layer 513, such as a protective insulating layer is formed over the first semiconductor channel layer 601. In one embodiment, layer 513 is a sacrificial silicon oxide layer 513. The sacrificial silicon oxide layer 513 can be formed as a conformal material layer, and in one embodiment may have a uniform thickness throughout. In one embodiment, the sacrificial silicon oxide layer 513 is deposited employing a conformal deposition process such as chemical vapor deposition or atomic layer deposition. A precursor including silicon atoms and oxygen atoms (such as tetraethylorthosilicate) can be employed to deposit the sacrificial silicon oxide layer 513. Alternatively or additionally, the sacrificial silicon oxide layer 513 can be formed by oxidizing surface portions of the first semiconductor material layer 601 employing at least one oxidation process. The at least one oxidation process can be selected from thermal oxidation and plasma oxidation. In this case, only a surface portion of the first semiconductor material layer 601 is converted into the sacrificial silicon oxide layer 513. An unoxidized continuous remaining portion of the first semiconductor material layer 601 having a reduced uniform thickness is provided between the sacrificial silicon oxide layer 513 and the tunneling dielectric layer 506. Alternatively, the layer 513 may comprise a material different from silicon oxide, such as silicon nitride, silicon oxynitride, etc.

In one embodiment, the sacrificial silicon oxide layer 513 can have a thickness in a range from 2 nm to 8 nm, such as from 3 nm to 7 nm. The sacrificial silicon oxide layer 513 includes outer vertical portions formed at levels of the insulating layers 32, inner vertical portions formed at levels of the sacrificial material layers 42, and annular portions connecting a respective neighboring pair of an outer vertical portion and an inner vertical portion of the sacrificial silicon oxide layer 513.

Referring to FIG. 4G, the layer stack including the sacrificial silicon oxide layer 513, the first semiconductor channel layer 601, the tunneling dielectric layer 506, the memory material layer 504, and the optional the blocking dielectric layer 502 is anisotropically etched employing at least one anisotropic etch process. Horizontal portions of the sacrificial silicon oxide layer 513, the first semiconductor channel layer 601, the tunneling dielectric layer 506, the memory material layer 504, and the optional the blocking dielectric layer 502 located above the top surface of the insulating cap layer 70 can be removed by the at least one anisotropic etch process. Further, the horizontal portions of the sacrificial silicon oxide layer 513, the first semiconductor channel layer 601, the tunneling dielectric layer 506, the memory material layer 504, and the at least one optional the blocking dielectric layer 502 at a bottom of each cavity 49' can be removed to physically expose a semiconductor surface that underlies the layer stack (513, 601, 506, 504, 502). The physically exposed semiconductor surface includes a top surface of the epitaxial channel portion 11, and can include a sidewall surface of the epitaxial channel portion 11 in case a region of the epitaxial channel portion 11 is recessed underneath an opening through the layer stack (513, 601, 506, 504, 502). Different etch chemistries can be employed during the at least one anisotropic etch process to sequentially etch through the various material of the layer stack (513, 601, 506, 504, 502).

The sacrificial silicon oxide layer 513 protects the first semiconductor channel layer 601 during the anisotropic etch. Due to the lateral undulation of the various layers in the layer stack (513, 601, 506, 504, 502) between respective outer vertical portions at levels of the insulating layers 32 and respective inner vertical portions at the levels of the sacrificial material layers 42, each layer within the layer stack (513, 601, 506, 504, 502) includes annular ledge portions that includes a horizontal or tapered annular top surface. In the absence of the sacrificial silicon oxide layer 513, the at least one anisotropic etch would collaterally damage surfaces of the first semiconductor channel layer 601. The sacrificial silicon oxide layer 513 protects the ledge portions and inner vertical portions of the first semiconductor channel layer 601 by covering the first semiconductor channel layer 601 throughout the at least one anisotropic etch process. The ledge portions (i.e., the annular portions) and the inner vertical portions of the sacrificial silicon oxide layer 513 can be collaterally damaged during the at least one anisotropic etch process. The inner periphery of the ledge portions of the sacrificial silicon oxide layer 513 can be the regions at which the collateral damage from the at least one anisotropic etch process is at a maximum, and are herein referred to as damage regions DR. The thickness of the sacrificial silicon oxide layer 513 can be selected such that the collateral damage in the damage regions DR does not propagate through the entire thickness of the sacrificial silicon oxide layer 513. In other words, the thickness of the sacrificial silicon oxide layer 513 can be selected such that remaining portions of the sacrificial silicon oxide layer 513 form a continuous layer without any hole therein so that the entire area of the first semiconductor channel layer 601 is protected during formation of the opening through the layer stack (513, 601, 506, 504, 502) above the epitaxial channel portion 11.

Vertical portions and annular portions of the sacrificial silicon oxide layer 513, first semiconductor channel layer 601, the tunneling dielectric layer 506, the memory material layer 504, and the optional the blocking dielectric layer 502 remain in each memory opening. Remaining portions of the memory material layer 504 at each level of the second material layers (e.g., the sacrificial material layers 42) constitute charge storage elements that are vertically spaced apart by complementary portions of the memory material layer 504 at the levels of the first material layers (e.g., the insulating layers 32). The memory material layer 504 can be a continuous layer, i.e., can be a charge storage layer.

A surface of the epitaxial channel portion 11 can be physically exposed underneath the opening through the sacrificial silicon oxide layer 513, the first semiconductor channel layer 601, the tunneling dielectric layer 506, the memory material layer 504, and the optional the blocking dielectric layer 502. Optionally, the physically exposed portion of the epitaxial channel portion 11 can be vertically recessed. The tunneling dielectric layer 506 is surrounded by the memory material layer 504. The memory material layer 504 can comprise a charge trapping material or a floating gate material.

The tunneling dielectric layer 506, the memory material layer 504, and the optional blocking dielectric layer 502 collectively constitutes a memory film 50. In one embodiment, the sacrificial silicon oxide layer 513, the tunneling dielectric layer 506, the memory material layer 504, and the blocking dielectric layer 502 can have vertically coincident sidewalls at the opening through the layer stack (513, 506, 504, 502) at the bottom of the cavity 49' above the epitaxial channel portion 11. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 4H, the sacrificial silicon oxide layer 513 is removed by an etch process that is selective to the semiconductor material of the first semiconductor channel layer 601. In one embodiment, the sacrificial silicon oxide layer 513 can be removed by an isotropic etch process (such as a wet etch process or a vapor phase etch process). In an illustrative example, in case the sacrificial silicon oxide layer 513 comprises a dielectric compound including silicon atoms and oxygen atoms (such as doped silicate glass, undoped silicate glass, organosilicate glass, or a porous derivative thereof), the sacrificial silicon oxide layer 513 can be removed by a wet etch employing dilute hydrofluoric acid.

Figure 4J:
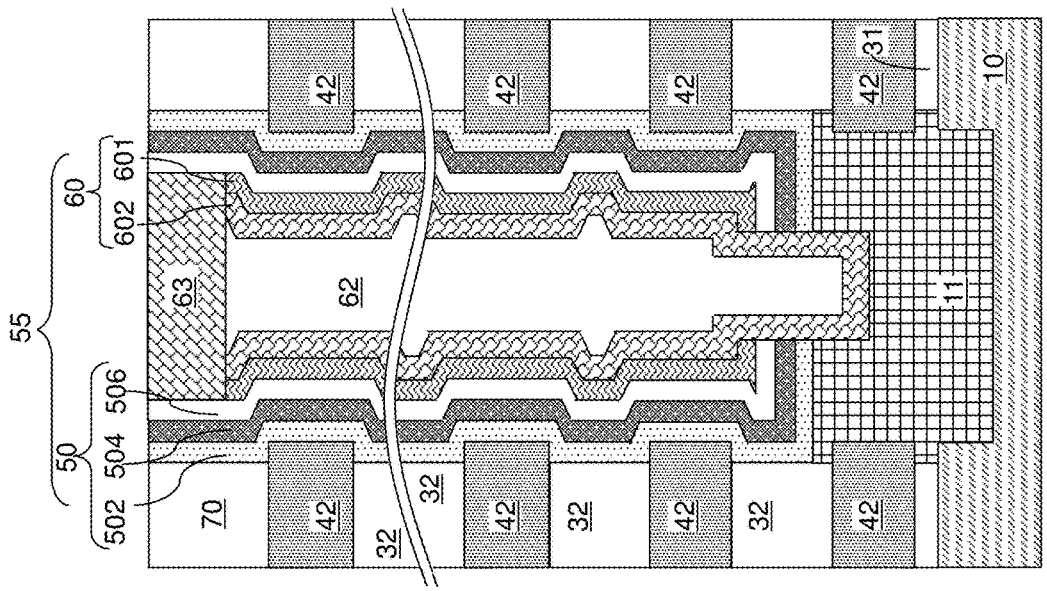
Figure 4I:
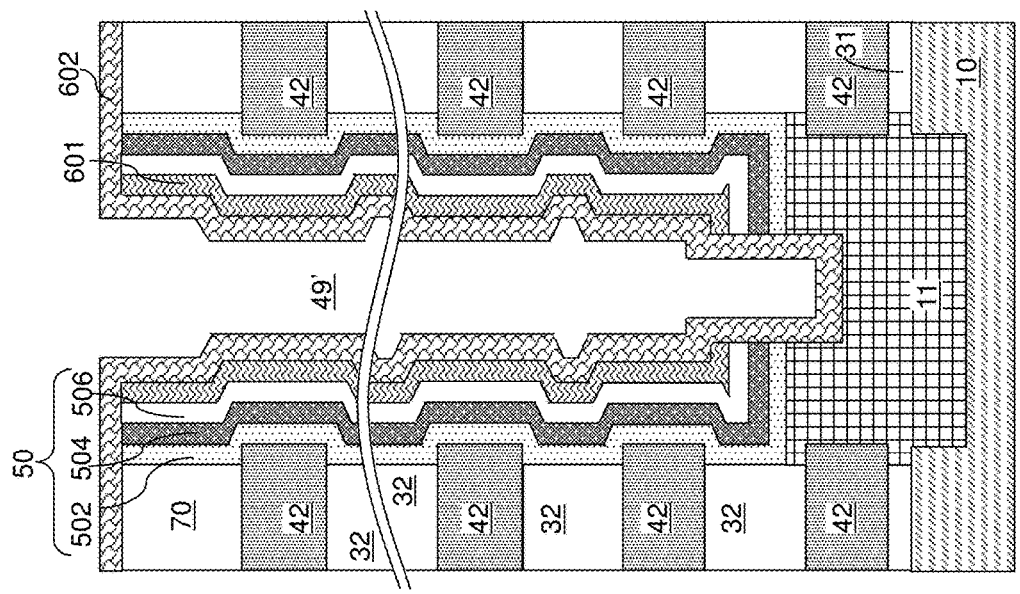

Referring to FIG. 4I, a second semiconductor channel layer 602 can be formed on the physically exposed surfaces of the epitaxial channel portion 11 and of the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. The semiconductor material of the second semiconductor channel layer 602 can be doped with dopants of the first conductivity type (i.e., of the same type of doping as the epitaxial channel portion 11 and the semiconductor material layer 10), or may be undoped (i.e., not intentionally doped).

In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The semiconductor channel layer 60L may partially fill the cavity 49' in each memory opening, or may fully fill the cavity in each memory opening. In one embodiment, the entirety of the first semiconductor channel layer 601 can have a first uniform thickness, and the entirety of the second semiconductor channel layer 602 can have a second uniform thickness.

Referring to FIG. 4J, in case the cavity 49' in each memory opening is not completely filled by the semiconductor channel layers (601, 602), a dielectric core layer can be deposited in the cavity 49' to fill any remaining portion of the cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

Subsequently, the horizontal portion of the dielectric core layer can be removed, for example, by a recess etch from above the top surface of the insulating cap layer 70. For example, the horizontal portion of the semiconductor channel layer located above the top surface of the insulating cap layer 70 can be removed by a planarization process, which can employ a recess etch or chemical mechanical planarization (CMP). Each remaining portion of the semiconductor channel layers (601, 602) within a memory opening constitutes a semiconductor channel 60, which is a vertical portion of a composite semiconductor channel that further includes a horizontal semiconductor channel to be subsequently formed in an upper portion of the substrate (9, 10), e.g., in an upper portion of the semiconductor material layer 10.

Electrical current can flow through the semiconductor channel 60 when a vertical NAND device including the semiconductor channel 60 is turned on. A tunneling dielectric layer 506 is surrounded by a memory material layer 504, and laterally surrounds a portion of the semiconductor channel 60. Each adjoining set of the blocking dielectric layer 502, a memory material layer 504, and a tunneling dielectric layer 506 collectively constitute a memory film 50, which can store electrical charges with a macroscopic retention time. In some embodiments, a blocking dielectric layer 502 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

The top surface of the remaining portion of the dielectric core layer can be further recessed within each memory opening, for example, by a recess etch to a depth that is located between the top surface of the insulating cap layer 70 and the bottom surface of the insulating cap layer 70. Each remaining portion of the dielectric core layer constitutes a dielectric core 62.

A drain region 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain region 63. Each pair of a memory film 50 and a semiconductor channel 60 located in a same memory opening constitutes a memory stack structure 55.

Figure 5:
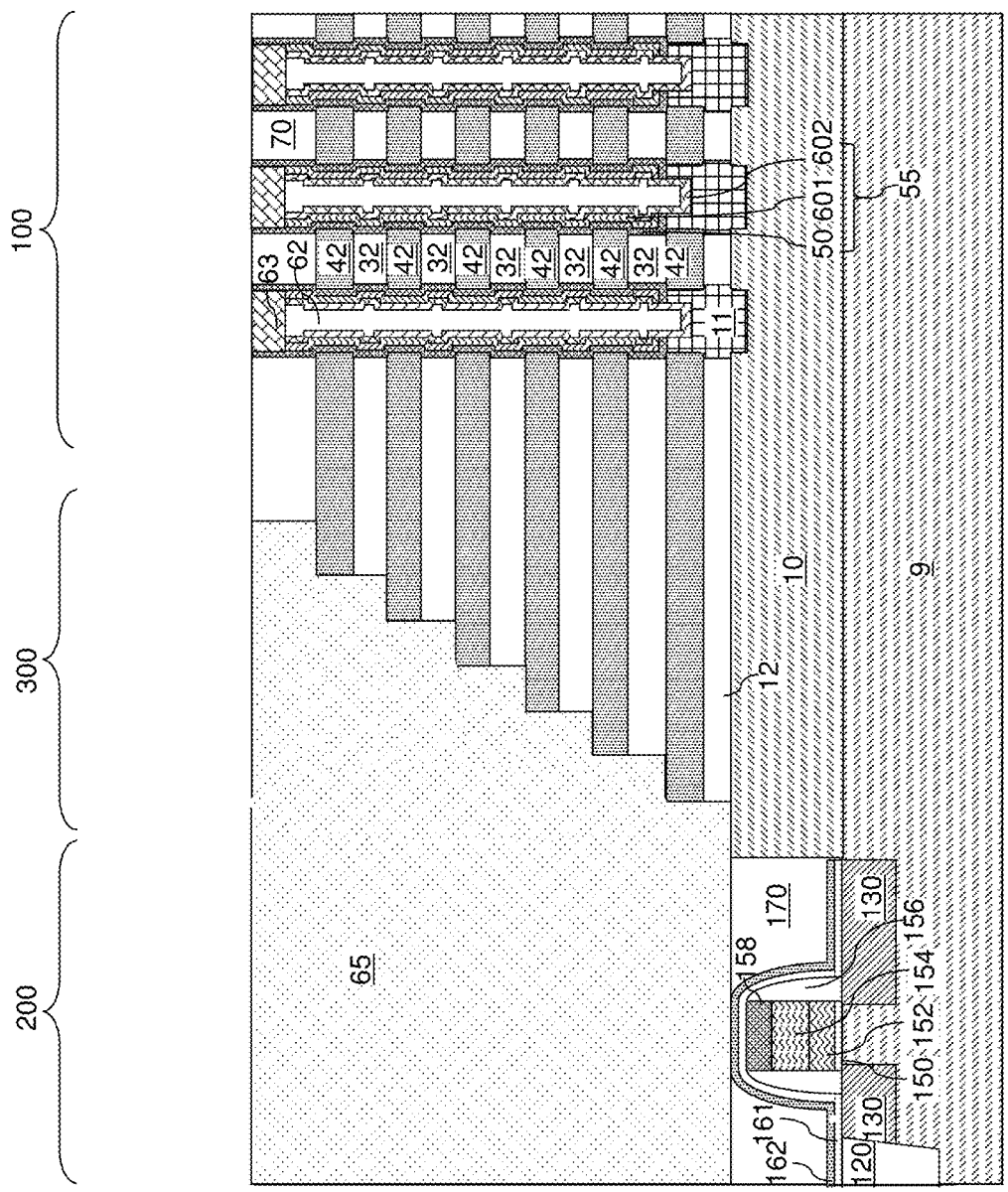
FIG. 5 is a vertical cross-sectional view of the exemplary structure after formation of memory stack structures according to an embodiment of the present disclosure.

Multiple instances of the exemplary memory stack structure 55 can be embedded into the memory openings 49 in the exemplary structure illustrated in FIG. 3. FIG. 5 illustrates the exemplary structure that incorporates multiple instances of the exemplary memory stack structure of FIG. 4J. The exemplary structure includes a semiconductor device, which comprises a stack (32, 42) including an alternating plurality of material layers (e.g., the sacrificial material layers 42) and insulating layers 32 located over a semiconductor substrate (9, 10), and a memory opening extending through the stack (32, 42). The semiconductor device further comprises a blocking dielectric layer 502 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated for a configuration for the memory stack structure 55, the methods of the present disclosure can be applied to alternative memory stack structures including a polycrystalline semiconductor channel.

Figure 6A:
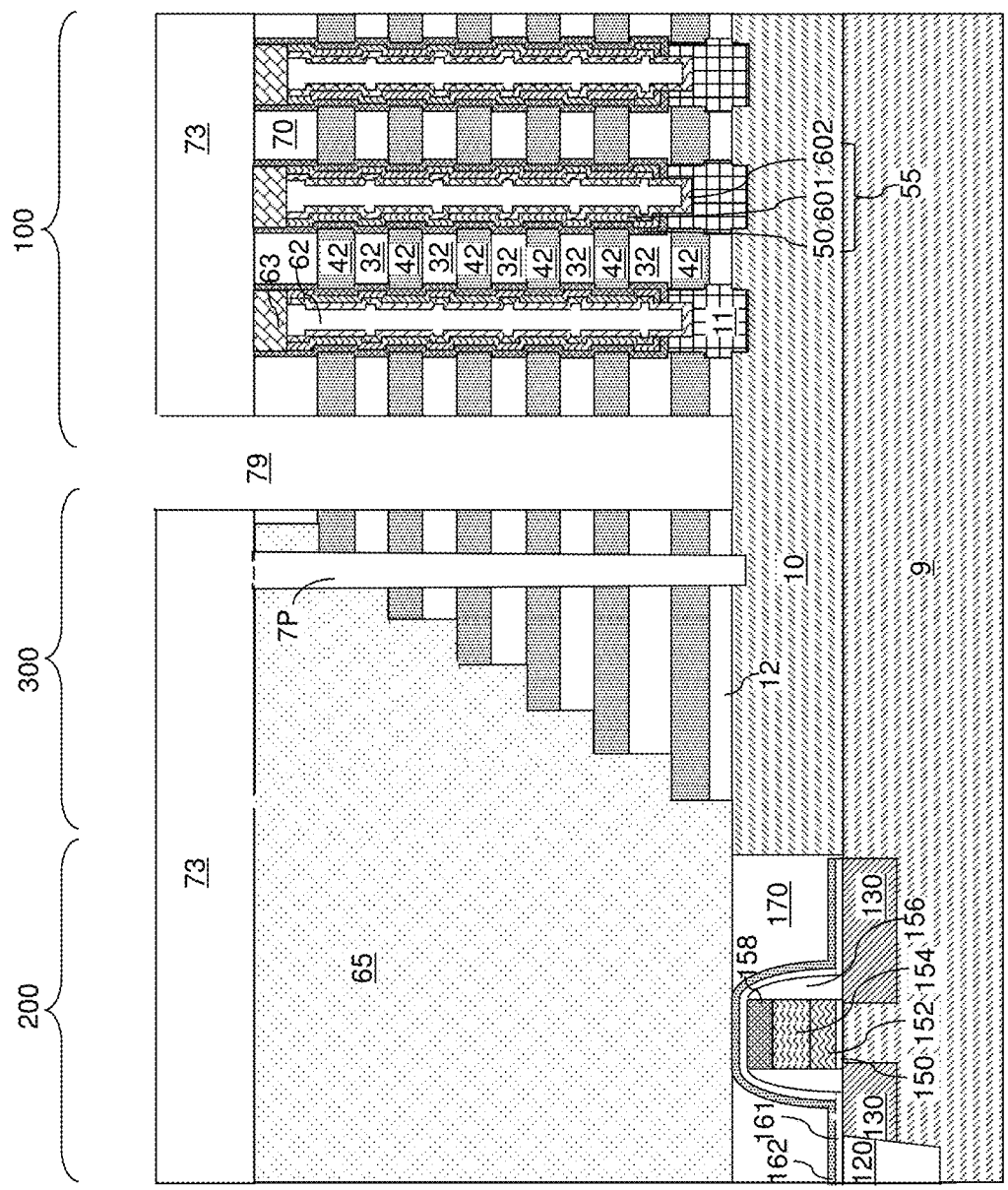
FIG. 6A is a vertical cross-sectional view of the exemplary structure after formation of a backside contact trench according to an embodiment of the present disclosure.

Referring to FIGS. 6A and 6B, at least one dielectric support pillar 7P may be optionally formed through the retro-stepped dielectric material portion 65 and/or through the insulating cap layer 70 and/or through the alternating stack (32, 42). The plane A-A' in FIG. 6B corresponds to the plane of the schematic vertical cross-sectional view of FIG. 6A. In one embodiment, the at least one dielectric support pillar 7P can be formed in the contact region 300, which is located adjacent to the memory array region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar can include silicon oxide and/or a dielectric metal oxide such as aluminum oxide. In one embodiment, the portion of the dielectric material that is deposited over the insulating cap layer 70 concurrently with deposition of the at least one dielectric support pillar 7P can be present over the insulating cap layer 70 as a contact level dielectric layer 73. Each of the at least one dielectric support pillar 7P and the contact level dielectric layer 73 is an optional structure. As such, the contact level dielectric layer 73 may, or may not, be present over the insulating cap layer 70 and the retro-stepped dielectric material portion 65. Alternatively, formation of the contact level dielectric layer 73 may be omitted, and at least one via level dielectric layer may be subsequently formed, i.e., after formation of a backside contact via structure.

The contact level dielectric layer 73 and the at least one dielectric support pillar 7P can be formed as a single continuous structure of integral construction, i.e., without any material interface therebetween. In another embodiment, the portion of the dielectric material that is deposited over the insulating cap layer 70 concurrently with deposition of the at least one dielectric support pillar 7P can be removed, for example, by chemical mechanical planarization or a recess etch. In this case, the contact level dielectric layer 73 is not present, and the top surface of the insulating cap layer 70 can be physically exposed.

A photoresist layer (not shown) can be applied over the alternating stack (32, 42), and is lithographically patterned to form at least one elongated opening in each area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed.

Figure 7:
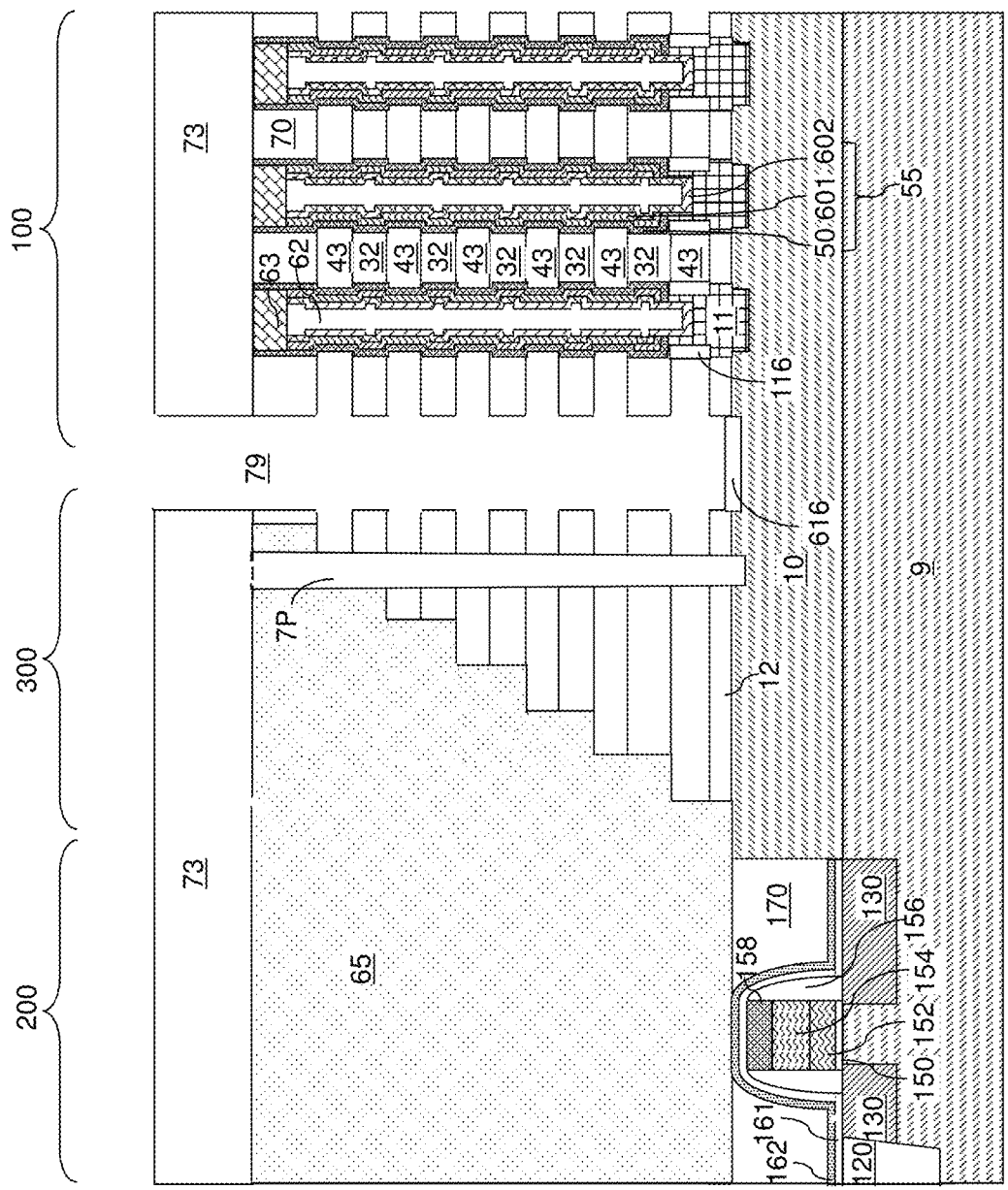
FIG. 7 is a vertical cross-sectional view of the exemplary structure after formation of backside recesses according to an embodiment of the present disclosure.

Referring to FIG. 7, an etchant that selectively etches the second material of the sacrificial material layers 42 with respect to the first material of the insulating layers 32 can be introduced into the at least one backside trench 79, for example, employing an etch process. Backside recesses 43 are formed in volumes from which the sacrificial material layers 42 are removed. The removal of the second material of the sacrificial material layers 42 can be selective to the first material of the insulating layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the at least one dielectric support pillar 7P, and the retro-stepped dielectric material portion 65 can be selected from silicon oxide, silicon nitride, and dielectric metal oxides. In this case, the depth of the at least one backside trench 79 can be modified so that the bottommost surface of the at least one backside trench 79 is located within the dielectric pad layer 12, i.e., to avoid physical exposure of the top surface of the semiconductor material layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Physically exposed surface portions of the optional epitaxial channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert each physically exposed surface portion of the semiconductor material layer 10 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the semiconductor material layer and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the semiconductor material layer 10.

Figure 8:
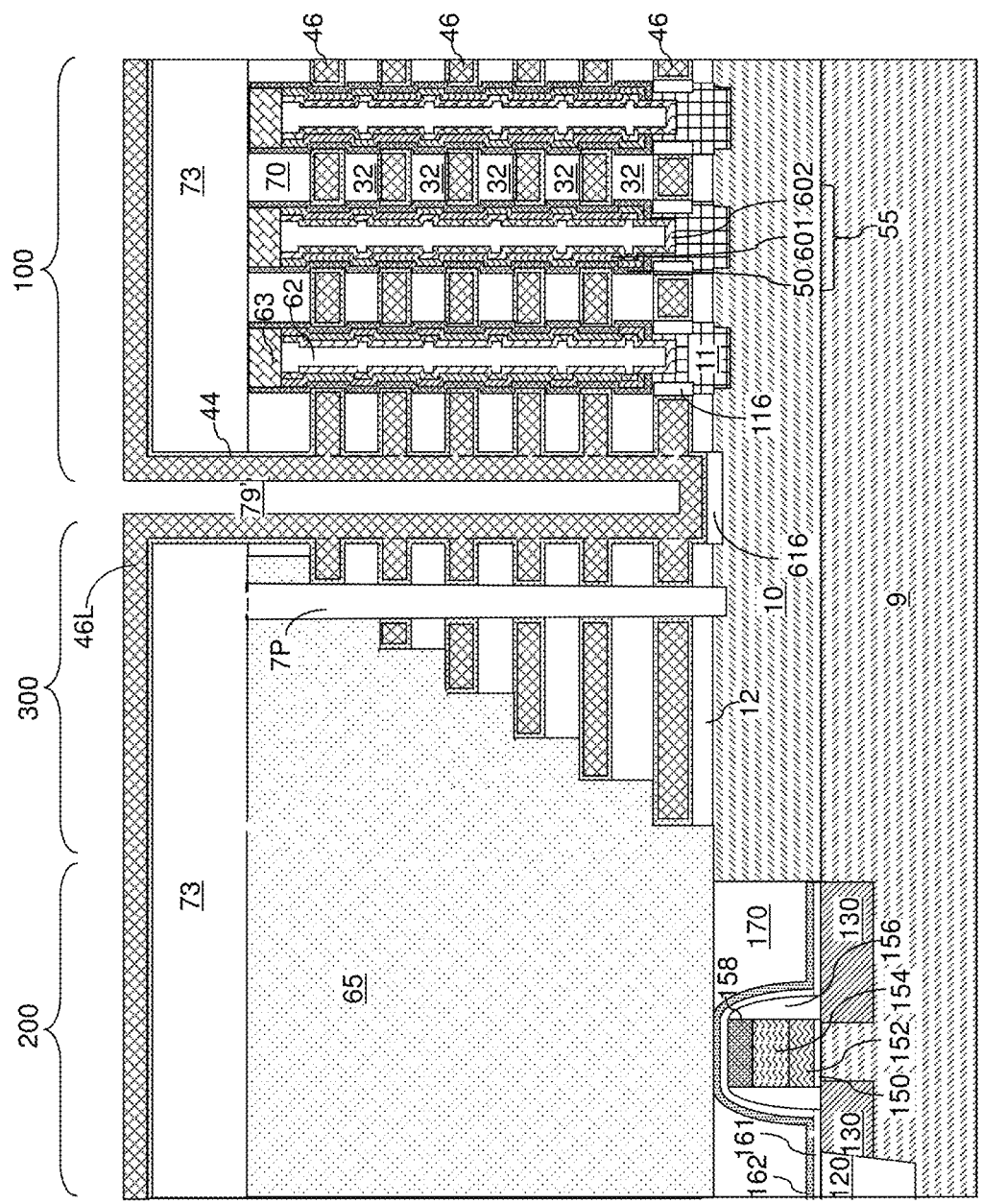
FIG. 8 is a vertical cross-sectional view of the exemplary structure after formation of electrically conductive layers according to an embodiment of the present disclosure.

Referring to FIG. 8, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 502 is present within each memory opening, the backside blocking dielectric layer is optional. In case the blocking dielectric layer 502 is omitted, the backside blocking dielectric layer is present.

The backside blocking dielectric layer 44 can be formed in the backside recesses 43 and on a sidewall of the backside contact trench 79. If the backside blocking dielectric layer 44 is formed, formation of the dielectric spacers 116 and the sacrificial dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The thickness of the backside blocking dielectric layer can be in a range from 1 nm to 10 nm, although lesser and greater thicknesses can also be employed. The backside blocking dielectric layer is formed on the sidewalls of the at least one backside via trench 79, horizontal surfaces and sidewalls of the insulating layers 32, the portions of the sidewall surfaces of the memory stack structures 55 that are physically exposed to the backside recesses 43, and a top surface of the sacrificial dielectric portion 616. A backside cavity 79' is present within the portion of each backside via trench 79 that is not filled with the backside blocking dielectric layer.

At least one metallic material can be deposited in the plurality of backside recesses 43, on the sidewalls of the at least one the backside contact trench 79, and over the top surface of the contact level dielectric layer 73. As used herein, a metallic material refers to an electrically conductive material that includes at least one metallic element.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material. In one embodiment, the metallic material can be deposited by chemical vapor deposition.

A plurality of electrically conductive layers 46 can be formed in the plurality of backside recesses 43, and a continuous metallic material layer 46L can be formed on the sidewalls of each backside contact trench 79 and over the contact level dielectric layer 73. Thus, each sacrificial material layer 42 can be replaced with an electrically conductive layer 46. A backside cavity 79' is present in the portion of each backside contact trench 79 that is not filled with the backside blocking dielectric layer and the continuous metallic material layer 46L. A dielectric spacer 116 laterally surrounds a semiconductor portion that underlies the lower doped semiconductor portion (e.g., portion 11), wherein one of the electrically conductive layers laterally surrounds the dielectric spacer upon formation of the electrically conductive layers.

Figure 9:
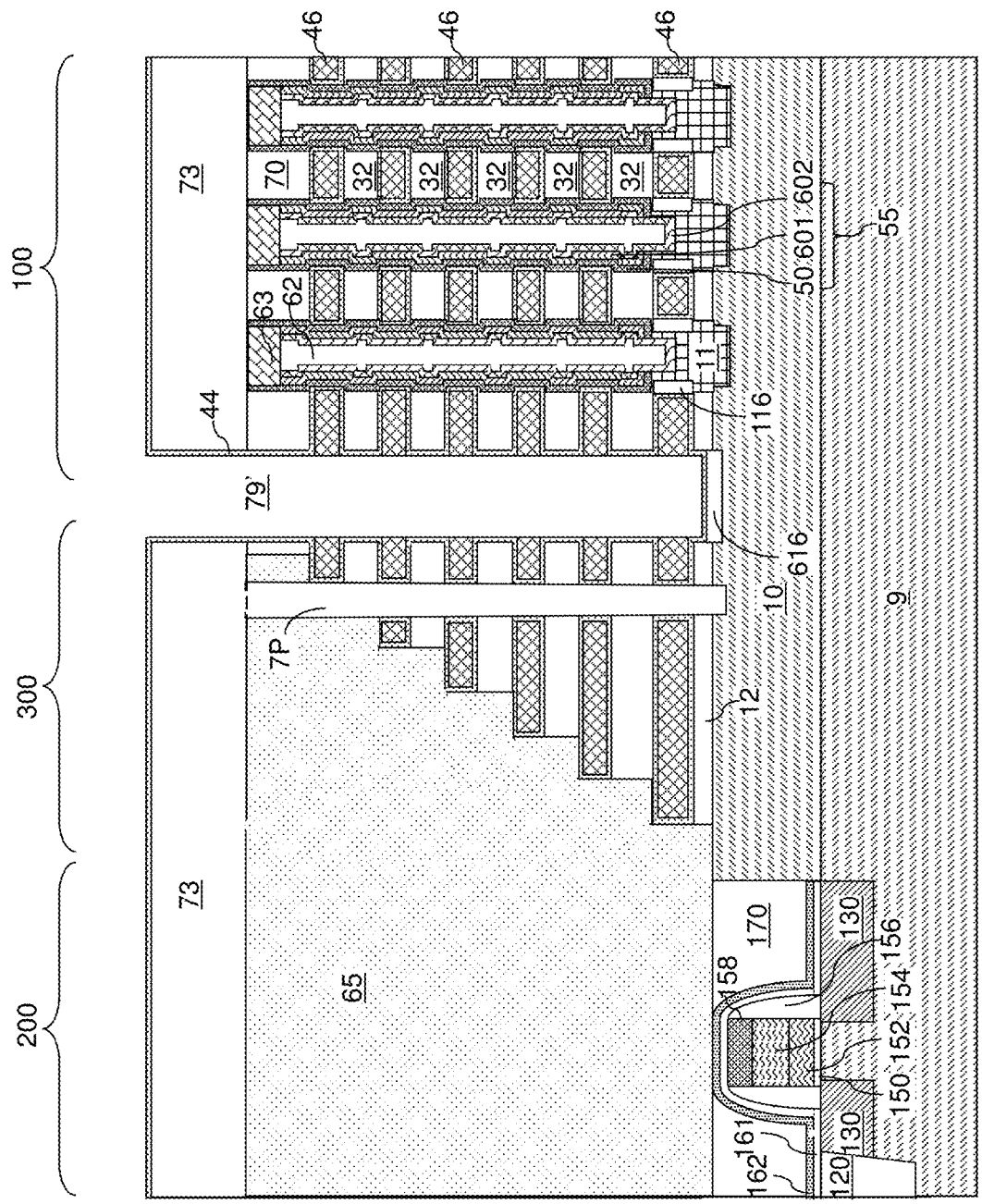
FIG. 9 is a vertical cross-sectional view of the exemplary structure after removing excess conductive material portions according to an embodiment of the present disclosure.

Referring to FIG. 9, the deposited metallic material of the continuous electrically conductive material layer 46L is etched back from the sidewalls of each backside contact trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

Figure 10:
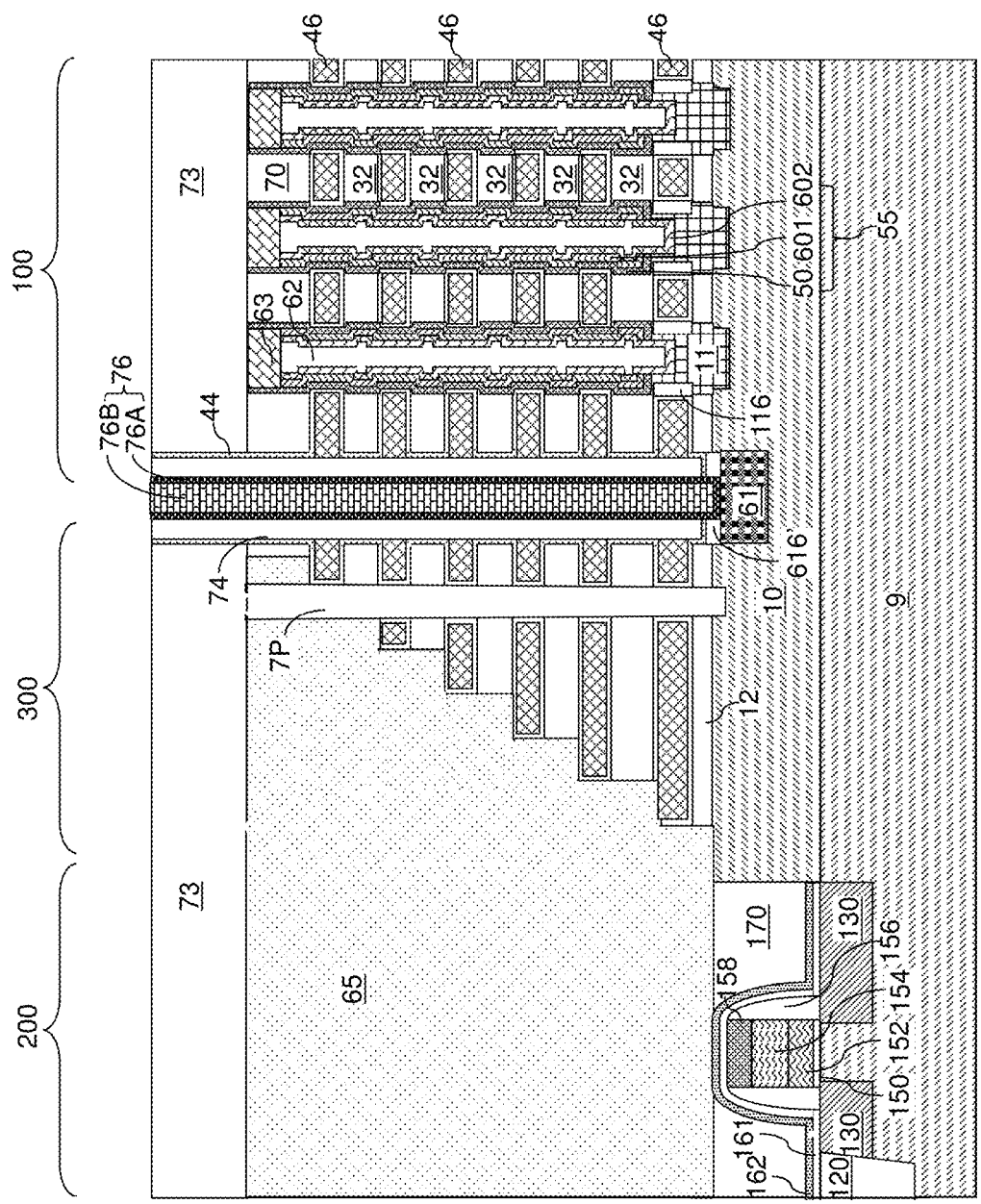
FIG. 10 is a vertical cross-sectional view of the exemplary structure after formation of a backside contact via structure according to an embodiment of the present disclosure.

Referring to FIG. 10, an insulating material layer can be formed in the at least one backside contact trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed. An anisotropic etch is performed to remove horizontal portions of the insulating material layer from above the contact level dielectric layer 73 and at the bottom of each backside contact trench 79. Each remaining portion of the insulating material layer constitutes an insulating spacer 74. Each insulating spacer 74 is formed on a sidewall of a respective backside contact trench 79 after formation of the electrically conductive layers 46.

A source region 61 can be formed at the bottom of each cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can contact a bottom surface of the insulating spacer 74.

A backside contact via structure 76 can be formed within each cavity 79'. Each backside contact via structure 76 can fill a respective cavity 79'. The contact via structures 76 can be formed by depositing at least one conductive material in the remaining unfilled volume (i.e., the backside cavity 79') of the backside contact trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside contact trenches 79 constitutes a backside contact via structure 76. Each backside contact via structure 76 can be formed directly on a top surface of a source region 61. Each backside contact via structure 76 is formed within a portion of the backside contact trench 79 that is not filled with an insulating spacer 74.

Figure 11:
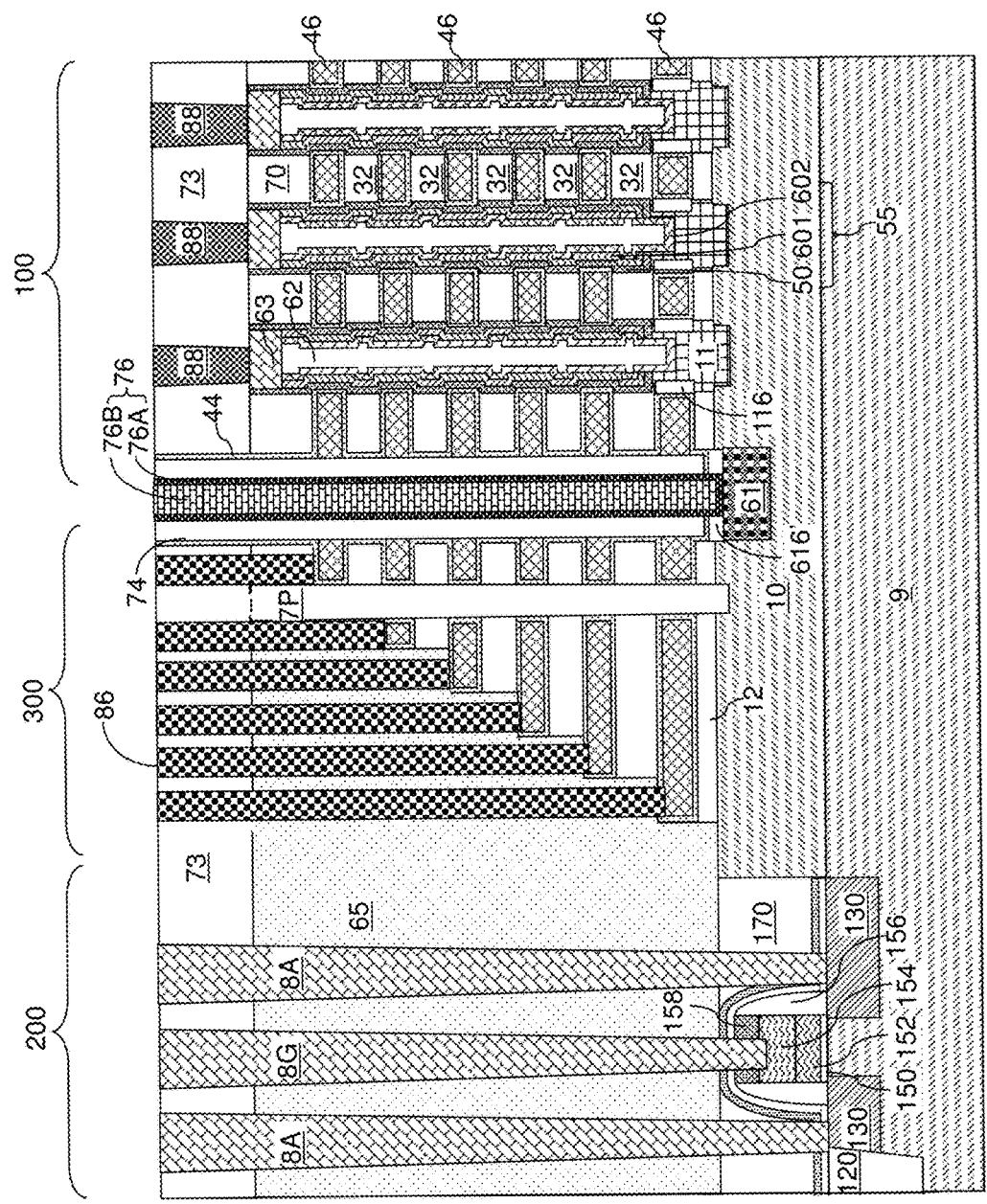
FIG. 11 is a vertical cross-sectional view of the exemplary structure after formation of various contact via structures according to an embodiment of the present disclosure.

Referring to FIG. 11, additional contact via structures (88, 86, 8A, 8G) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral gate contact via structures 8G and peripheral active region contact via structures 8A can be formed through the retro-stepped dielectric material portion 65 directly on respective nodes of the peripheral devices.

Figure 12:
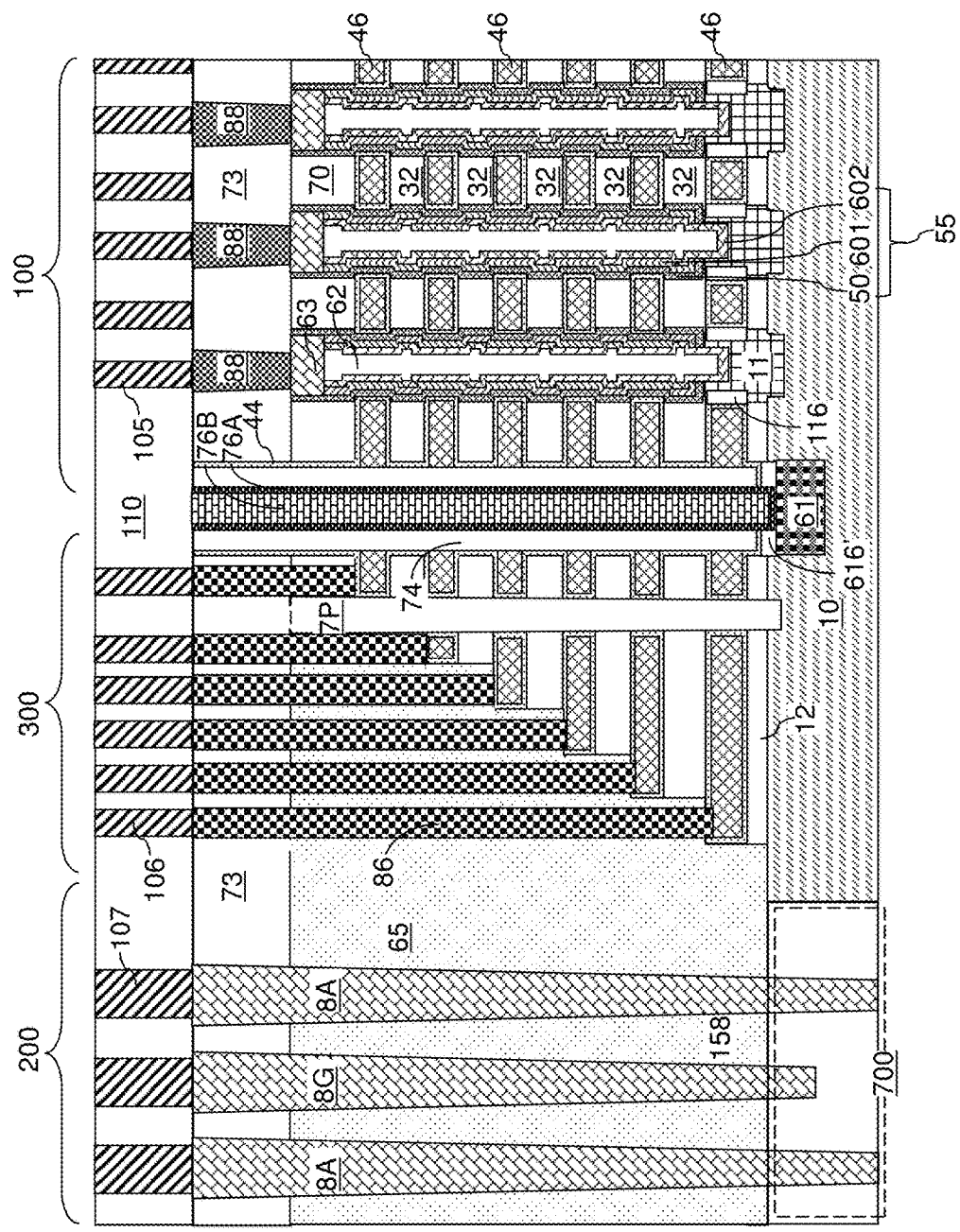
FIG. 12 is a vertical cross-sectional view of the exemplary structure after formation of bit lines and metal interconnect line structures according to an embodiment of the present disclosure.

Referring to FIG. 12, a line level dielectric layer 110 can be deposited over the contact level dielectric layer. Conductive lines can be formed in the line level dielectric layer, for example, by patterning line trenches extending through the line level dielectric layer 110 and filling the line trenches with at least one conductive material. The conductive lines can include bit lines 105 contacting the drain contact via structures 88 and extending along a horizontal direction, word line interconnection lines 106 that contact the word line contact via structures 86, and peripheral device interconnection lines 107 that contact the peripheral contact via structures (8A, 8G).

The exemplary structure includes a monolithic three-dimensional memory device. The monolithic three-dimensional memory device comprises a stack of alternating layers comprising insulating layers 32 and electrically conductive layers 46 and located over a substrate (9, 10), an array of memory openings extending through the stack; and a plurality of memory stack structures 55 located within a respective memory opening. Each electrically conductive layer 46 can laterally surround the plurality of memory stack structures 55. Each memory stack structure 55 extends through the stack of alternating layers. Each memory stack structure 55 can include a memory film 50 including an optional backside blocking dielectric layer 502, a memory material layer 504, and a tunneling dielectric layer 506. A semiconductor channel 60 is surrounded by the memory film 50 in the memory stack structure 55. The tunneling dielectric layer 506 can comprise an ONO stack, and can contact the semiconductor channel 60.

In one embodiment, the semiconductor device of the present disclosure can include a monolithic three-dimensional memory device. The monolithic three-dimensional memory device can include a vertical NAND device located over the substrate. The electrically conductive layers 46 can comprise, or can be electrically connected to, a respective word line of the vertical NAND device. The substrate (9, 10) can include a silicon substrate, which may be provided in the form of the substrate semiconductor layer 9. The vertical NAND device can comprise an array of monolithic three-dimensional NAND strings located over the silicon substrate. At least one memory cell in a first device level of the three-dimensional array of NAND strings can be located over another memory cell in a second device level of the three-dimensional array of NAND strings. The silicon substrate can contain an integrated circuit comprising a driver circuit for the memory device located thereon.

The array of monolithic three-dimensional NAND strings can include a plurality of semiconductor channels 60, wherein at least one end portion of each of the plurality of semiconductor channels extends substantially perpendicular to a top surface of the substrate (9, 10); a plurality of charge storage elements (as embodied as portions of the memory material layer 504 located at each level of the electrically conductive layers 46), each charge storage element located adjacent to a respective one of the plurality of semiconductor channels 60; and a plurality of control gate electrodes (as embodied as portions of the electrically conductive layers 46) having a strip shape extending substantially parallel to the top surface of the substrate (9, 10), wherein the plurality of control gate electrodes comprises at least a first control gate electrode located in a first device level and a second control gate electrode located in a second device level.

In the absence of the protective layer (e.g., the sacrificial silicon oxide layer) 513, the at least one anisotropic etch of FIG. 4G may collaterally damage exposed horizontal or inclined surfaces of the first semiconductor channel layer 601 and may cause a hole to form in these surfaces of the first semiconductor channel layer 601. If a hole forms in these surfaces of the first semiconductor channel layer 601, then the underlying tunneling dielectric 506 and/or memory material layer (i.e., charge storage or charge trapping layer, such as a silicon nitride layer) 504 underlying the hole in the first semiconductor channel layer 601 may also be etched away or damaged during the anisotropic etch to form a word line leak in the area of the hole. This may render the memory cells containing the damaged layers inoperable or decrease their quality.

In contrast, the protective layer (e.g., sacrificial silicon oxide layer) 513 described above protects the first semiconductor channel layer 601 during the anisotropic etch. The presence of layer 513 prevents or reduces holes in layer 601 and resulting damage to layers 506 and/or 504. Furthermore, since the protective layer 513 protects the underlying layers, the thickness of layer 601 may be reduced because layer 601 is not require to act as the sole protective layer during the etching step of FIG. 4G. The reduced thickness of layer 601 may improve the device performance. Furthermore, the channel 60 layers 601, 602 may have a more uniform thicknesses due to the presence of layer 513.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of manufacturing a semiconductor device, comprising:
   forming a stack of alternating layers comprising insulating layers and spacer material layers over a substrate including a semiconductor material;
   forming a memory opening through the stack;
   recessing sidewalls of the insulating layers selective to sidewalls of the spacer material layers after formation of the memory opening;
   forming a layer stack including a memory material layer, a tunneling dielectric layer, and a first semiconductor channel layer in the memory opening, wherein recessing of the sidewalls of the insulating layers is performed prior to formation of the layer stack;
   forming a protective layer over the first semiconductor channel layer;
   physically exposing a semiconductor surface of the semiconductor material of the substrate underneath the layer stack by anisotropically etching horizontal portions of the protective layer and the layer stack at a bottom portion of the memory opening;
   removing a remaining portion of the protective layer selective to the first semiconductor channel layer; and
   forming a second semiconductor channel layer on the first semiconductor channel layer.

2. The method of claim 1, wherein the protective layer comprises a sacrificial silicon oxide layer which includes:
   outer vertical portions formed at levels of the insulating layers;
   inner vertical portions formed at levels of the sacrificial material layers; and
   annular portions connecting a respective neighboring pair of an outer vertical portion and an inner vertical portion of the sacrificial silicon oxide layer.

3. The method of claim 2, wherein an anisotropic etch process employed to anisotropically etch the horizontal portions of the sacrificial silicon oxide layer and the layer stack at the bottom of the memory opening collaterally etches inner surfaces of the annular portions of the sacrificial silicon oxide layer.

4. The method of claim 3, wherein the sacrificial silicon oxide layer has a thickness in a range from 2 nm to 8 nm.

5. The method of claim 2, wherein each of the memory material layer, the tunneling dielectric layer, and the first semiconductor channel layer comprises:
   respective outer vertical portions formed at levels of the insulating layers;
   respective inner vertical portions formed at levels of the sacrificial material layers; and
   respective annular portions connecting a respective neighboring pair of an outer vertical portion and an inner vertical portion.

6. The method of claim 1, wherein:
   an entirety of the first semiconductor channel layer has a first uniform thickness after formation of the second semiconductor channel layer; and
   an entirety of the second semiconductor channel layer has a second uniform thickness.

7. The method of claim 1, wherein:
   the protective layer comprises a sacrificial silicon oxide layer; and
   removal of the remaining portion of the protective layer selective to the first semiconductor channel layer is performed employing an isotropic etch process employing hydrofluoric acid.

8. The method of claim 7, wherein the sacrificial silicon oxide layer is formed as a conformal material layer having a uniform thickness throughout.

9. The method of claim 8, wherein the sacrificial silicon oxide layer is formed by oxidizing surface portions of the first semiconductor channel layer employing at least one oxidation process selected from thermal oxidation and plasma oxidation.

10. The method of claim 8, wherein the sacrificial silicon oxide layer is deposited employing a conformal deposition process selected from chemical vapor deposition and atomic layer deposition.

11. The method of claim 1, further comprising forming an epitaxial channel portion at a bottom portion of the memory opening prior to forming the layer stack, wherein a single crystalline structure of the epitaxial channel portion is in epitaxial alignment with a single crystalline structure of the semiconductor material of the substrate.

12. The method of claim 11, further comprising cleaning the physically exposed semiconductor surface of the semiconductor material of the substrate exposed below the memory opening to remove a surface oxide material prior to formation of the epitaxial channel portion, wherein sidewalls of the insulating layers are collaterally recessed laterally selective to sidewalls of the spacer material layers during cleaning of the physically exposed surface of the semiconductor material of the substrate.

13. The method of claim 12, wherein:
the insulating layers comprise silicon oxide;
the spacer material layers comprise silicon nitride; and
cleaning of the physically exposed surface of the semiconductor material of the substrate and collateral recessing of the insulating layers is performed by an isotropic etch employing hydrofluoric acid.

14. The method of claim 1, wherein:
the first and the second semiconductor channel layers comprise silicon layers;
the protective layer comprises a sacrificial silicon oxide layer;
removing the remaining portion of the protective layer selective to the first semiconductor channel layer comprises etching the sacrificial silicon oxide layer selective to the first semiconductor channel layer using hydrofluoric acid;
the memory material layer comprises silicon nitride; and
the tunneling dielectric layer comprises an ONO stack.

15. The method of claim 1, further comprising:
forming a blocking dielectric layer on a sidewall of the memory opening, wherein the layer stack is deposited on the blocking dielectric layer;
forming a dielectric core directly on an inner surface of the second semiconductor channel layer;
removing a portion of the second semiconductor channel layer from above the stack of alternating layers; and
forming a drain region in an upper portion of the memory opening and over the dielectric core.

16. The method of claim 1, wherein:
the semiconductor device is a three-dimensional memory device; and
the spacer material layers comprise conductive material layers patterned into control gate electrodes of the three-dimensional memory device.

17. The method of claim 1, wherein:
the semiconductor device is a three-dimensional memory device; and
the spacer material layers comprise sacrificial material layers; and
the method further comprises removing the sacrificial material layers selective to the insulating layers to form lateral recesses, and subsequently filling the lateral recesses with conductive material layers which comprise control gate electrodes of the three-dimensional memory device.

18. The method of claim 17, further comprising:
forming a backside contact trench through the stack of alternating layers, wherein removal of the sacrificial material layers is performed by introducing an etchant through the backside contact trench;
forming an insulating spacer on a sidewall of the backside contact trench after formation of the electrically conductive layers; and
forming a backside contact via structure within a portion of the backside contact trench that is not filled with the insulating spacer.

19. The method of claim 1, wherein:
the semiconductor device includes a monolithic three-dimensional memory device comprising a vertical NAND device located over the substrate;
the electrically conductive layers comprise, or are electrically connected to, a respective word line of the vertical NAND device;
the substrate comprises a silicon substrate;
the vertical NAND device comprises an array of monolithic three-dimensional NAND strings located over the silicon substrate;
at least one memory cell in a first device level of the three-dimensional array of NAND strings is located over another memory cell in a second device level of the three-dimensional array of NAND strings;
the silicon substrate contains an integrated circuit comprising a driver circuit for the memory device located thereon; and
the array of monolithic three-dimensional NAND strings comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate, wherein the plurality of control gate electrodes comprises at least a first control gate electrode located in a first device level and a second control gate electrode located in a second device level.

* * * * *